US009860992B1

(12) United States Patent
Chao et al.

(10) Patent No.: US 9,860,992 B1
(45) Date of Patent: Jan. 2, 2018

(54) PROTECTIVE LAYERING PROCESS FOR CIRCUIT BOARDS

(71) Applicant: The United States of America as Represented by the Secretary of the Army, Washington, DC (US)

(72) Inventors: Nien-Hua Chao, Parsippany, NJ (US); John A. Dispenza, Long Valley, NJ (US); Mario DeAngelis, Ringoes, NJ (US)

(73) Assignee: The United States of America as Represented by the Secretary of the Army, Washington, DC (US)

( * ) Notice: Subject to any disclaimer, the term of this patent is extended or adjusted under 35 U.S.C. 154(b) by 139 days.

(21) Appl. No.: 14/963,920

(22) Filed: Dec. 9, 2015

Related U.S. Application Data

(62) Division of application No. 13/682,980, filed on Nov. 21, 2012, now Pat. No. 9,254,588.

(60) Provisional application No. 61/563,939, filed on Nov. 28, 2011.

(51) Int. Cl.
| | |
|---|---|
| B29C 41/20 | (2006.01) |
| H05K 3/00 | (2006.01) |
| H05K 3/46 | (2006.01) |

(52) U.S. Cl.
CPC ......... *H05K 3/0014* (2013.01); *H05K 3/0047* (2013.01); *H05K 3/4644* (2013.01); *H05K 2203/1316* (2013.01); *H05K 2203/1322* (2013.01)

(58) Field of Classification Search
CPC .. B29C 41/20; B29C 41/48; H05K 2203/1316
See application file for complete search history.

(56) References Cited

U.S. PATENT DOCUMENTS

| | | | | |
|---|---|---|---|---|
| 6,483,719 | B1 * | 11/2002 | Bachman | H05K 9/003 174/378 |
| 6,757,181 | B1 * | 6/2004 | Villanueva | H01L 23/16 174/357 |
| 7,089,646 | B2 * | 8/2006 | Leerkamp | H05K 9/003 174/373 |
| 7,446,265 | B2 * | 11/2008 | Krohto | H05K 9/003 174/369 |
| 8,434,220 | B2 * | 5/2013 | Rao | H01L 23/552 29/831 |
| 2002/0129951 | A1 * | 9/2002 | Babb | H01L 23/552 174/358 |
| 2009/0065240 | A1 * | 3/2009 | Onodera | B32B 27/36 174/252 |

(Continued)

*Primary Examiner* — James Sanders
(74) *Attorney, Agent, or Firm* — John P. DiScala

(57) ABSTRACT

A polymer layering process that encapsulates and protects electronics components with complex and imprecise geometries. The protective layering process provides a combination of a flexible mold and/or a rigid mold that apply close-forming, encapsulating the polymer layers to the electronic components and precision assemblies. Polymer layer protective jackets are shaped to as-populated circuit boards and assemblies, providing tightly fit barriers with fine resolution accommodating imprecise geometries. The protective jackets can be formed in rigid, semi-rigid, or highly flexible polymer films, to protect the circuitry from the elements, CTE mismatches, shock and vibration loads and extreme g-forces.

10 Claims, 20 Drawing Sheets

(56) References Cited

U.S. PATENT DOCUMENTS

| | | | |
|---|---|---|---|
| 2009/0152688 A1* | 6/2009 | Do | H01L 23/552 257/659 |
| 2009/0277662 A1* | 11/2009 | Shiue | A63B 33/002 174/50.51 |
| 2009/0315156 A1* | 12/2009 | Harper | H01L 23/552 257/660 |
| 2010/0319981 A1* | 12/2010 | Kapusta | H05K 9/0024 174/350 |
| 2011/0035038 A1* | 2/2011 | Keulen | B44B 1/006 700/98 |
| 2011/0085316 A1* | 4/2011 | Myers | H05K 3/284 361/818 |

* cited by examiner

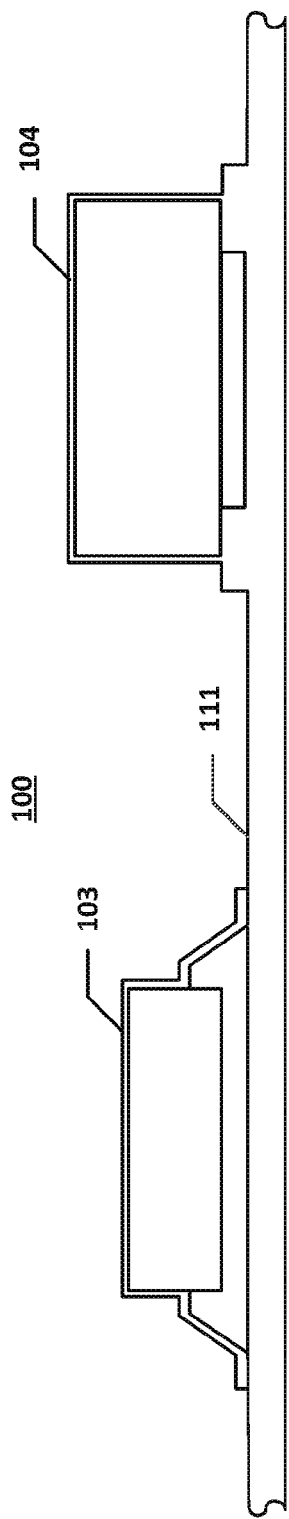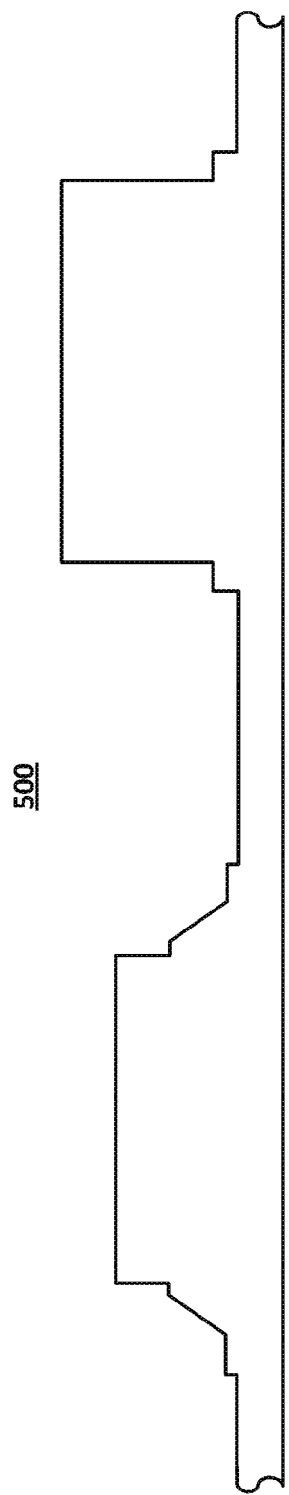

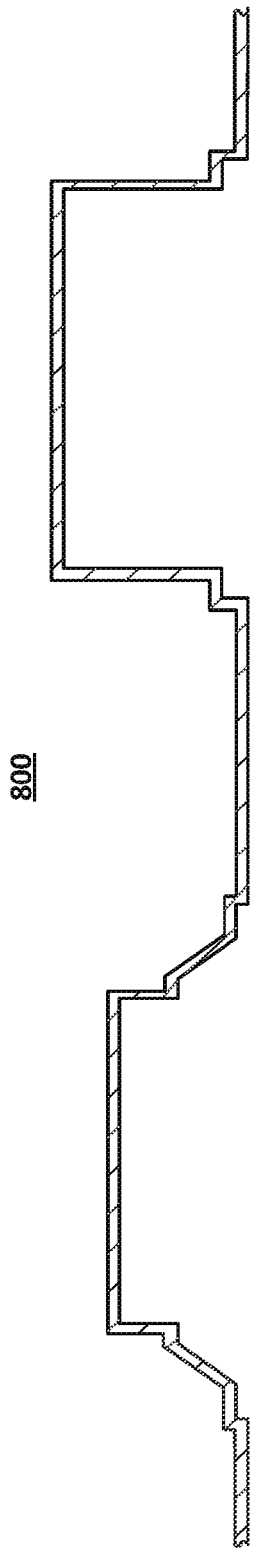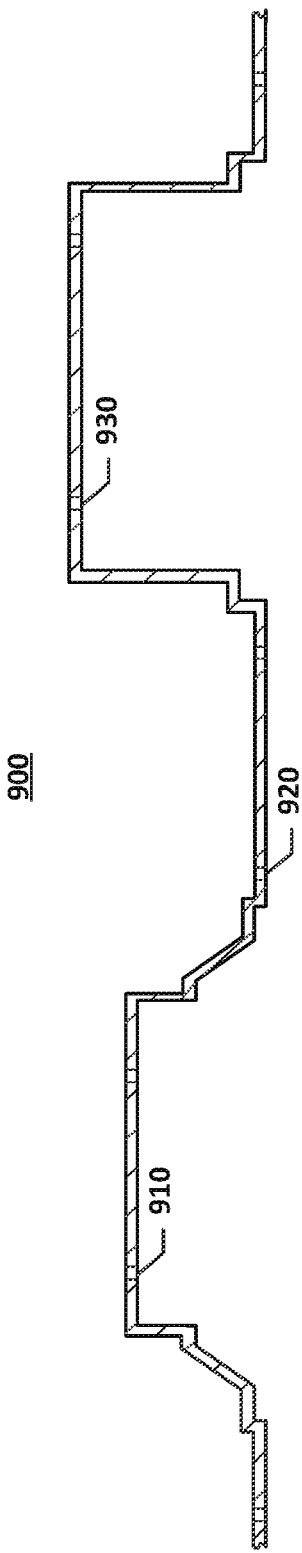

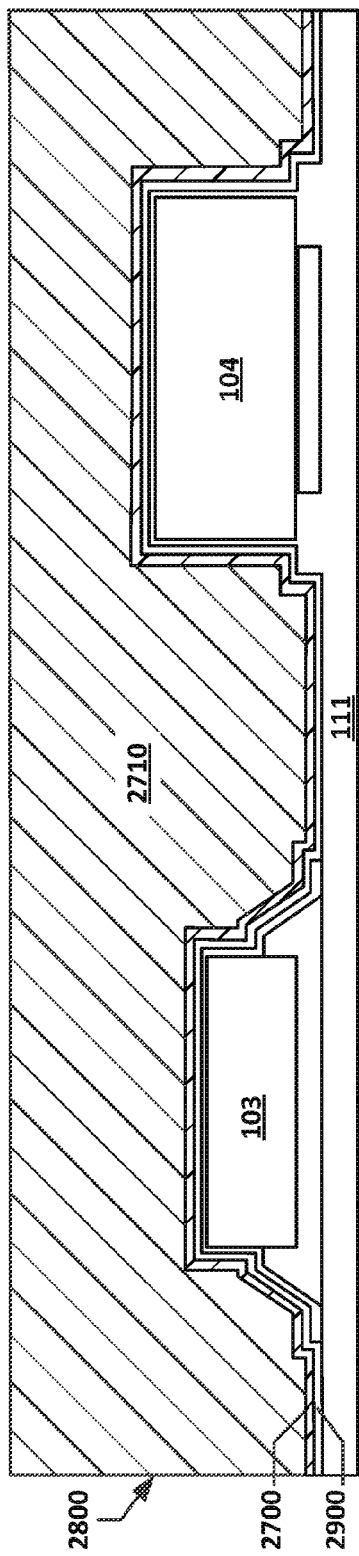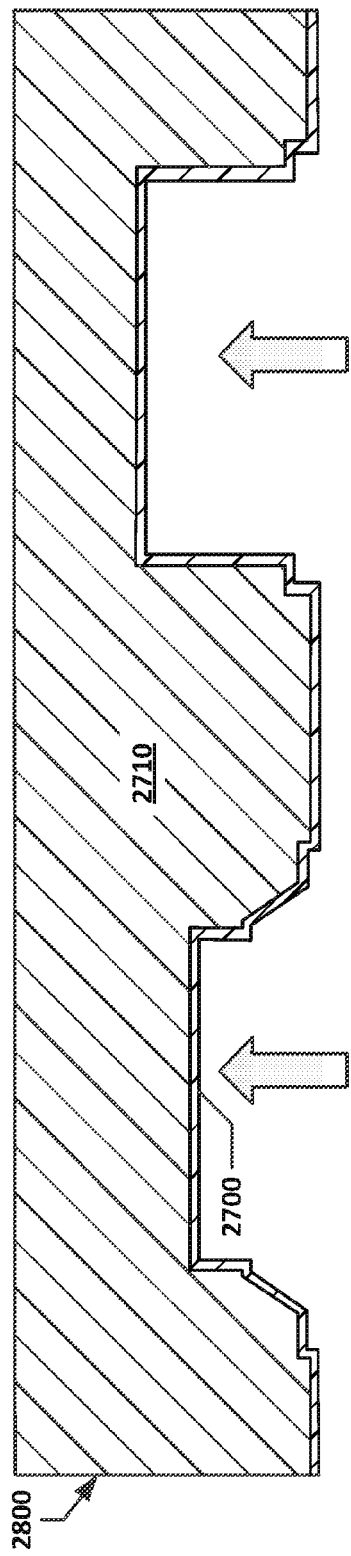

US 9,860,992 B1

PROTECTIVE LAYERING PROCESS FOR CIRCUIT BOARDS

CROSS-REFERENCE TO RELATED APPLICATIONS

This application is a Divisional of U.S. patent application Ser. No. 13/682,980 filed Nov. 21, 2012, which claims the benefit under 35 USC §119(e) of U.S. provisional patent application 61/563,939, filed on Nov. 28, 2011, both of which are incorporated by reference in their entirety.

GOVERNMENTAL INTEREST

The invention described herein may be manufactured and used by, or for the Government of the United States for governmental purposes without the payment of any royalties thereon.

FIELD OF THE INVENTION

The present invention relates in general to the field of circuit board manufacturing. More specifically, this invention relates to an improved, protective, thin film layering process that protects electronic components with complex and imprecise geometries. The protective layering process provides a combination of a flexible mold and a rigid mold, or another means to produce the same, that apply close-forming, encapsulating polymer or other layers to the electronic components.

BACKGROUND OF THE INVENTION

Conformal coatings are widely used in both the military and industrial electronics applications, for protecting circuit board assemblies from moisture, dust, chemicals, and temperature extremes, to prevent damage or failure of the electronic components. While the use of conformal coatings offers several advantages compared to uncoated circuit board assemblies, their application constitutes a "wet-process" which requires the use of hazardous chemicals that must be applied by spraying, brushing, or dipping, followed by drying and/or curing processes.

In addition, it would be difficult to control the conformal coating thickness as well as the formation of pin-holes. With the exception of parylene, which must be applied by expensive vacuum-deposition equipment and which does not lend itself to high-volume production, most organic conformal coatings are readily penetrated by water molecules.

For a conformal coating to be effective, ionizable contaminants, such as salts, must be prevented from reaching the circuit nodes where they can combine with water to form microscopically thin electrolyte layers that can be both corrosive and electrically conductive. Also, for the conformal coatings to adhere properly to the circuit board assemblies, thereby minimizing peeling, de-wetting, and the propensity to form pin-holes, all surface contamination must be removed prior to the application of the conformal coating, using another "wet-process" such as a vapor degreasing or semi-aqueous washing in a special equipment. Special shielding and masking measures must also be taken while applying the conformal coatings to prevent it from contaminating connectors, sensitive components and the circuit board assemblies.

The application of a close-fitting, thin-layer of polymer, or another material in flat-sheet form, over the circuit board assembly and its electronic components, either by a vacuum or pressure molding, or by other suitable processes, would offer superior protection from moisture, dust, chemicals, and temperature extremes compared to conformal coatings. A thin polymer layer, or multiple thin layers, could be selected to provide various additional attributes, such as, improved heat dissipation, ESD and EMI protection and control, and protection from handling and in-use shocks.

Thin polymer layers could be added to the circuit board assemblies for use in non-potted as well as potted applications. In potted applications, the polymer layers would offer additional benefits such as forming a barrier to prevent the potting material from seeping into areas around and underneath sensitive components. After being cured, potting materials could cause high stresses, such as a residual stress and a thermal expansion stress, during temperature cycling, due to the coefficient of thermal expansion mismatches and also due to contraction and expansion of the potting material itself.

More specifically, potting materials are being used with increasing frequency, in both commercial and military applications, to encapsulate the electronic components and circuit board assemblies of electronic systems. The use of potting materials allows for a simpler support-structure (while also enabling a smaller over-all system design) as well as enhanced structural support for the electronic components and circuit board assemblies against shock and vibration.

A major disadvantage with encapsulants or potting materials however, is the fact that they are permanent solid bodies that prevent any access or servicing of the components they encapsulate. Potting materials are almost always thermoset materials that harden once and cannot not be re-softened or reused In numerous military munition designs, where the electronic components must survive the extremely high g-forces experienced during gun-launch, the potted electronics are inactive until the munition is used. Until this time the munition may have been in storage without environmental (temperature and humidity) controls for up to 20 years.

In contrast, the electronics for most commercial applications tend to be active for most of their lifetime where the operating environment is more stable and predictable. Without external temperature controls, or the fairly constant temperature environment that active electronics create for themselves, inactive electronic components experience continuously varying physical stresses which are created due to their intimate contact with the potting material and the different rates of expansion and contraction that each produces with changes in temperature. If the changes in temperature are severe enough, or repeated a sufficient number of times, the physical stresses induced on the inactive electronic components can be severe. The resultant loads or stresses can be high enough to fracture the ceramic lids of hollow-cavity devices, or other types of electronic components, and may also lift components completely off of their circuit boards.

In addition, during the potting process, the potting material may seep into the open spaces between the leads of the chips and also underneath the chip packaging. The potting material that has seeped into these areas will create residual stresses in the solder joints and also against the packaging bottom surface after the potting material has solidified during the curing process.

Currently, the following failures have been observed for potted electronics during either the temperature-cycling qualification process or the life test (temperature-cycling and gun-launch) of a sub-system of the fielded-artillery system:

1. Solder joints failed during the temperature-cycling process.
2. Solder joints failed during the life test.
3. Lids and lid-seals cracked on MEMS (e.g. MEMS—Micro-Electro-Mechanical Systems) open-cavity devices during the temperature-cycling process and also during the life test.
4. Tiny electronic devices pulled off from their circuit boards during the temperature-cycling process.

The application of a barrier, such as a thin layer of polymer (or other material), over the electronic components prior to the addition of the potting material, is believed necessary to help mitigate the above failures. The polymer layer can be applied by various processes such as heat, vacuum, vacuum plug assist, radio frequency forming or a combination of processes, or a combination of the above.

For failures resulting from the solder joints failure and components being pulled off their circuit board assemblies during temperature cycling, the polymer layer would prevent the potting material from intruding between the chip-leads and also under the chips, and thus help prevent the push and pull stresses that the potting material would produce as it expands and contracts with increasing/decreasing temperatures.

For failure resulting from both lids and lid-seals being cracked on hollow-cavity devices, the polymer layer would provide: 1) a low-adhesion boundary between the potting material and the lid surfaces thereby mitigating the high shear-stresses that would develop as the potting material expands and contracts due to ambient temperature fluctuation, and 2) a compliant layer that would minimize the high-compression stresses that the potting material develops when it expands, due to increasing temperatures, and high-tension stresses that the potting material develops when it shrinks, due to decreasing temperatures, against the lids of these devices.

What is therefore needed is a process of forming and emplacing the thin polymer, or other formable composite, layers so as to precisely conform to the imprecise geometries of the electronic components on the circuit board assemblies, despite the imprecise geometries of these components due to their geometrical tolerance, placement tolerance as well as the manufacturing and assembly variances of the circuit board assemblies. It would also be substantially advantageous that the polymer layers be sufficiently strong to provide the structural support of the potting to the circuit board assemblies during high-g force events. It would further be desirable to have the thin polymer layers be sufficiently flexible to allow for differentials in coefficients of thermal expansion between the circuit board assemblies and the potting material.

Certain publications, such as U.S. Pat. No. 5,318,855, propose a method to vacuum form a polymer film over the circuit board assemblies to provide electrical and environmental protection. However, the proposed method does not seem to allow the polymer layer to precisely conform to the electronic components.

U.S. Pat. Nos. 4,959,752 and 4,768,286 suggest vacuum forming polymer layers over a circuit board assembly to closely conform to the geometry of the circuit board assembly prior to the application of the potting material. However, these layers must be thin enough to permit vacuum forming over the circuit board assemblies, and are therefore too thin to provide sufficient structural support or to provide sufficient boundary to differential thermal expansion.

Another process of forming multiple layer films into packages to protect printed circuit boards is described in U.S. Pat. No. 7,161,092. This patent generally describes a method of forming a plurality of layers to cover the approximate shape of a printed circuit board assembly as opposed to mounting the electronic components in a container or enclosure. This method describes the bonding of at least three layers (i.e., insulating, conductive, and abrasion protection) into a conformal film that can be stamped or pressed, and then adhered to the electronic component assemblies, which may require breather valves. The surface tension of the individual layers usually provides an approximate fit, that is a fit with substantial radii or a loose fit encapsulating technique.

What is therefore needed is a process of forming the layers without the need for bonding individual foyers together, and that produces a very tight fit between the polymer layers and the circuit board assembly. In addition, desirable process would not require adhesives or melting operations to join the layers to the circuit board assembly, and would provide an exacting polymer layer fit that facilitates snapping of the polymer layer to the assembly it is designed to protect. Such a desirable process would provide a polymer layer that follows the contours (or profiles) of all the electronic components on the circuit board assembly and would allow for variances in dimensional tolerances, placement and assembly. Prior to the advent of the present invention, the need for such a protective layering process has heretofore remained unsatisfied.

SUMMARY OF THE INVENTION

The present invention satisfies this need, and describes an improved protective layering process that protects electronics components with complex and imprecise geometries. The protective layering process uses a combination of a flexible mold and/or a rigid mold that apply close-forming, encapsulating polymer layers (or other composite layers created from other formable materials) to the electronic components.

The imprecise geometries are due to the normal electronic component geometrical tolerances as well as position-variations inherent in the manufacturing processes of the circuit board assemblies. It is an objective of the present invention to provide molding tools and forming methodologies that apply equal pressure, which will make the protective layers tightly fit to the electronic components of the circuit board assemblies, even perpendicular to the direction of molding. The soft durometer of the flexible mold face will flow or deform around individual components, applying force on sides of components in addition to the projected or top surfaces of components. This dual-material mold design is ideally suited to form polymer layers or other formable composite over electronic devices with varying tolerances.

To this end, the present invention includes a method for encapsulating a circuit board assembly for enhanced survivability in harsh and extreme environments with a thin polymer layer (or other composited layers created from other formable materials) tightly fit to the possible imprecise, as-built geometries of a populated, circuit board assembly. By precision scanning a circuit board assembly, and using the derived data, a male and/or a female mold can be created which is a substantially exact representation of the geometries of a completed circuit board assembly.

The data may be adjusted to scale the pattern, and therefore the associated mold, to allow for layer thicknesses, to form multiple successively larger layers, which may include thermally conductive, electromagnetic shielding layers, layers for impact protection, environmental protection, which may be placed on top of the first layer, to account for associated mold shrinkage, production polymer layer (or other formable composite layers) shrinkage, or for other reasons.

The polymer layer may be heated and a vacuum may be drawn through the mold, pulling the heated layer into a substantially precise representation of the circuit board assembly. The mold may also be heated, which allows for better temperature control of the thin polymer layer as it is formed, as opposed to an unheated mold, or as opposed to forming the layer directly against the circuit board assembly.

This forming (or molding) process allows for a substantially precise layer or layers to be produced using a broad range of materials, including such materials that may not be formed directly against the circuit board assembly. Formed layers may be applied to the circuit board assembly by physical emplacement, with the aid of heat and/or air pressure, with a precisely formed rigid mold or with the aid of a conformal mold or by a combination of rigid and conformal molds.

The conformal mold may have a rigid backing or reinforcement layer (heated or unheated) and a soft, front layer which substantially matches the various geometries of the circuit board assembly. When pressure is applied and the soft, conformal mold comes in contact with polymer covered circuit board assembly components, and is forced to flow or deform around individual components, the mold applies force on the sides of components as well as to the projected or top surfaces of the electronic components. The result of compressing the conformal mold over the polymer layer and the circuit board assembly is a protective layer that is tightly fitted to all components.

This method of encapsulating the circuit board assembly is particularly advantageous to create a barrier layer between the circuit board assembly and the potting compound which may be applied on top of the thin layer. As stated earlier, the polymer layer is precisely formed to the imprecise, as-built geometries of the circuit board assembly.

The polymer layer may be fabricated to be both flexible enough to protect the circuit board assembly from damage caused by differentials in coefficients of thermal expansion, due to environment temperature fluctuations, between the circuit board assembly and the potting material, without any 2011-02701V 9 appreciable degradation in the structural support provided to the circuit board assembly by the potting materials during extreme, high-g force events.

The advantages of the present invention include but are not limited to:
  Provide a barrier for all lead frames, chip carrier frames, miniature electronic devices, wired devices and all solder joints from direct contact with the potting material, which will then reduce the stresses caused by the expansion, contraction, and lifting-action caused by the potting material during changes in temperature.
  Provide a flexible stress-reducing medium between the electronic components of the circuit board assembly and the potting material during changes in temperature and also during high shock/vibration events.
  Eliminate the shear forces experienced by the electronic components, due to adherence of the potting material, during changes in temperature and also during high shock/vibration events.
  Create a barrier that prevents the potting material from flowing between the electrical leads and also underneath the electronic packaging/components, thereby preventing the potting material from pushing/pulling the components off the circuit board during changes in temperature.
  Provide a moisture barrier between the electronic components and the operating environment.
  Provide EMI shielding both from nearby internal electronic components and also from EMI sources external to the electronic components.
  Provide a low-adhesion interface between the electronic components and the potting material that will allow for easier dissection/serviceability of the circuit board assembly.
  Provide a thermal dissipation medium for high-heat generating electronic components.
  Provide one or more of the following to the circuit board assembly: chemical protection, corrosion protection, contamination protection, salt spray protection, fungus protection, dust protection.

These and other advantages and features of the present invention will be more readily understood from the following detailed description of preferred embodiments of the invention that is provided in connection with the accompanying drawings.

BRIEF DESCRIPTION OF THE DRAWINGS

The above and other features of the present invention and the manner of attaining them, will become apparent, and the invention itself will be best understood, by reference to the following description and the accompanying drawings, wherein:

FIGS. 4 through 9 are illustrations of the various steps of the mold making phase of the layering process of FIG. 3;

FIGS. 25 through 30 are illustrations of the various steps of the conformal mold making phase of FIG. 24;

Similar numerals refer to similar elements in the drawings. It should be understood that the sizes of the different components in the figures are not necessarily in exact proportion or to scale, and are shown for visual clarity and for the purpose of explanation.

DETAILED DESCRIPTION OF PREFERRED EMBODIMENTS

Figure 1:
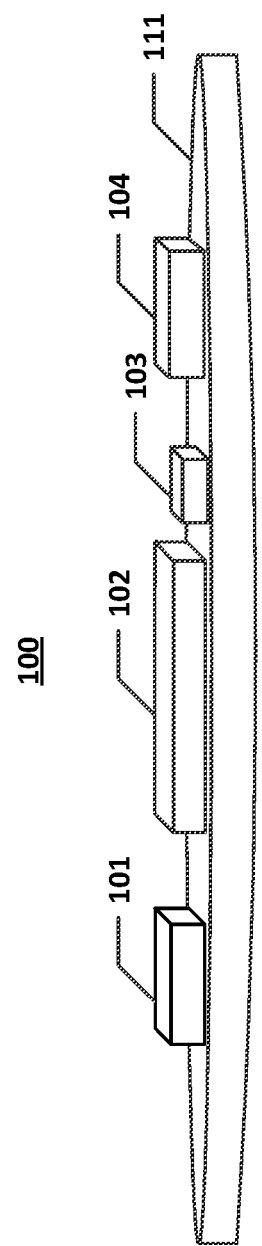
FIG. 1 is a perspective view of an exemplary circuit board assembly to be protectively layered according to present invention.

FIG. 1 illustrates an exemplary circuit board assembly 100 which is to be protectively layered according to present invention, in order to protect electronics components 101, 102, 103, 104 with complex and imprecise geometries, that are secured (e.g., soldered) to a circuit board 111. To this end, the present invention includes a protective layering process 200 that is generally illustrated in FIG. 2.

The process 200 generally comprises two phases: a mold making phase 300 (as further illustrated in FIGS. 3-9 and 24-30), and a polymer layer forming phase 1000 (1500 or 1900, as further illustrated in FIGS. 10-23 and 31-33). These phases 300 and 1000 (1500 and 1900) will now be described in greater detail.

Figure 2:
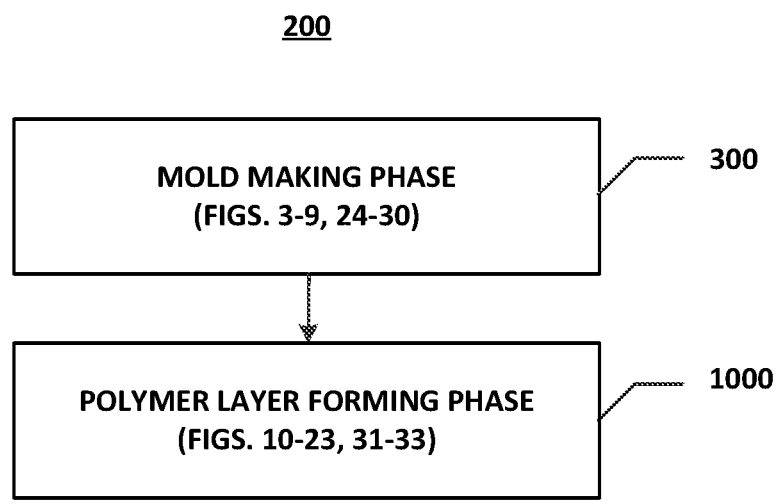
FIG. 2 is a high level flow chart of a layering process, which includes a mold making phase and a polymer layer forming phase according to the present invention.
Figure 3:
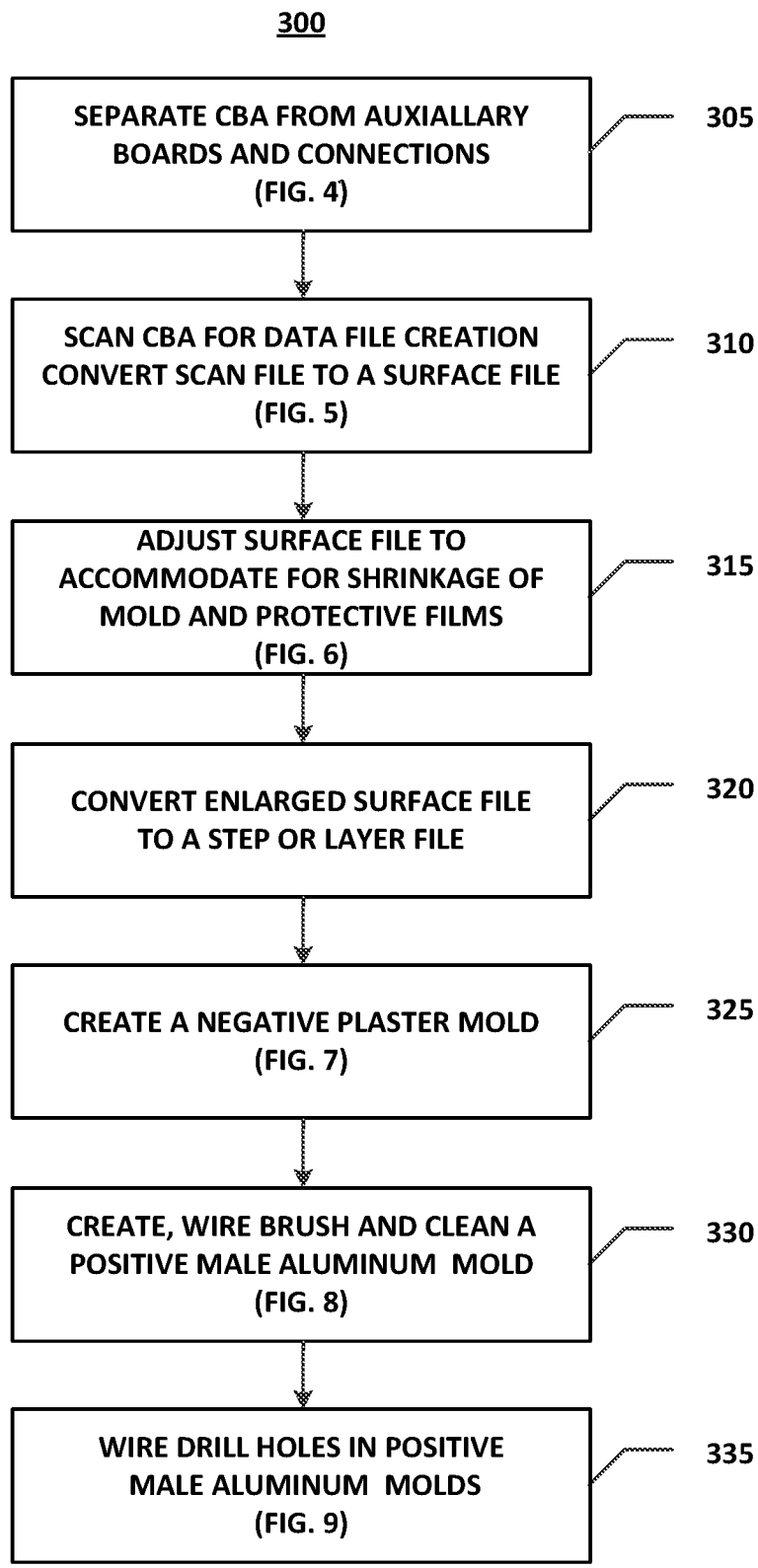
FIG. 3 is a more detailed flow chart of the mold making phase of the layering process of FIG. 2.
Figure 6:
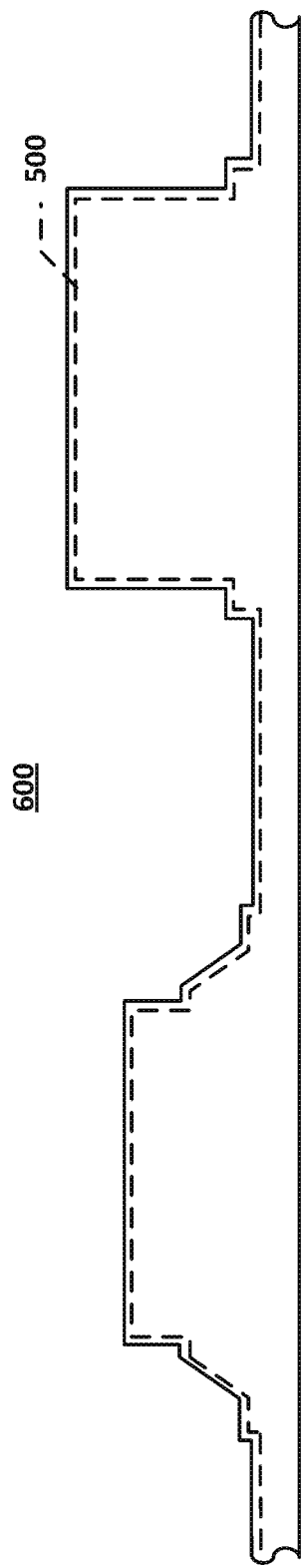

FIG. 3 provides a more detailed flow chart of the mold making phase 300 of the layering process 200 of FIG. 2. An aspect of forming the polymer layers according to the present invention, for the circuit board assembly 100, is to provide polymer layers with a substantially exact fit to the circuit board assembly 100. To create a mold that duplicates the circuit board assembly 100 exactly, it is determined that a mold cast from a populated circuit board assembly 100 would be superior to a machined mold. A machined mold would need to have been made from a CAD file that might not include all the imperfections or imprecise geometries of the actual populated circuit board assembly 100. It is important that the process 200 would allow for the shrinkage in both the mold casting process (e.g., aluminum) and the thermoplastic forming phase 1000 (FIG. 10) of the actual polymer layers.

At step 305 of FIG. 3, and as further illustrated in FIG. 4, the main circuit board assembly 100 to be protected is separated from auxiliary boards and connections.

At step 310 and as further illustrated in FIG. 5, the circuit board assembly 100 is scanned. A point cloud file 500 is then created from the scanned image. A white light laser computer tomography device (CT scan) may be used to trace the intricate physical geometries of the circuit board assembly 100, and to record all its features in the electronic point cloud file 500. The point cloud scan file (geometric points) is converted into a data or surface file by grouping the points into surfaces which are also blended or stitched together to form a single computer aided design/CAD file.

Figure 10:
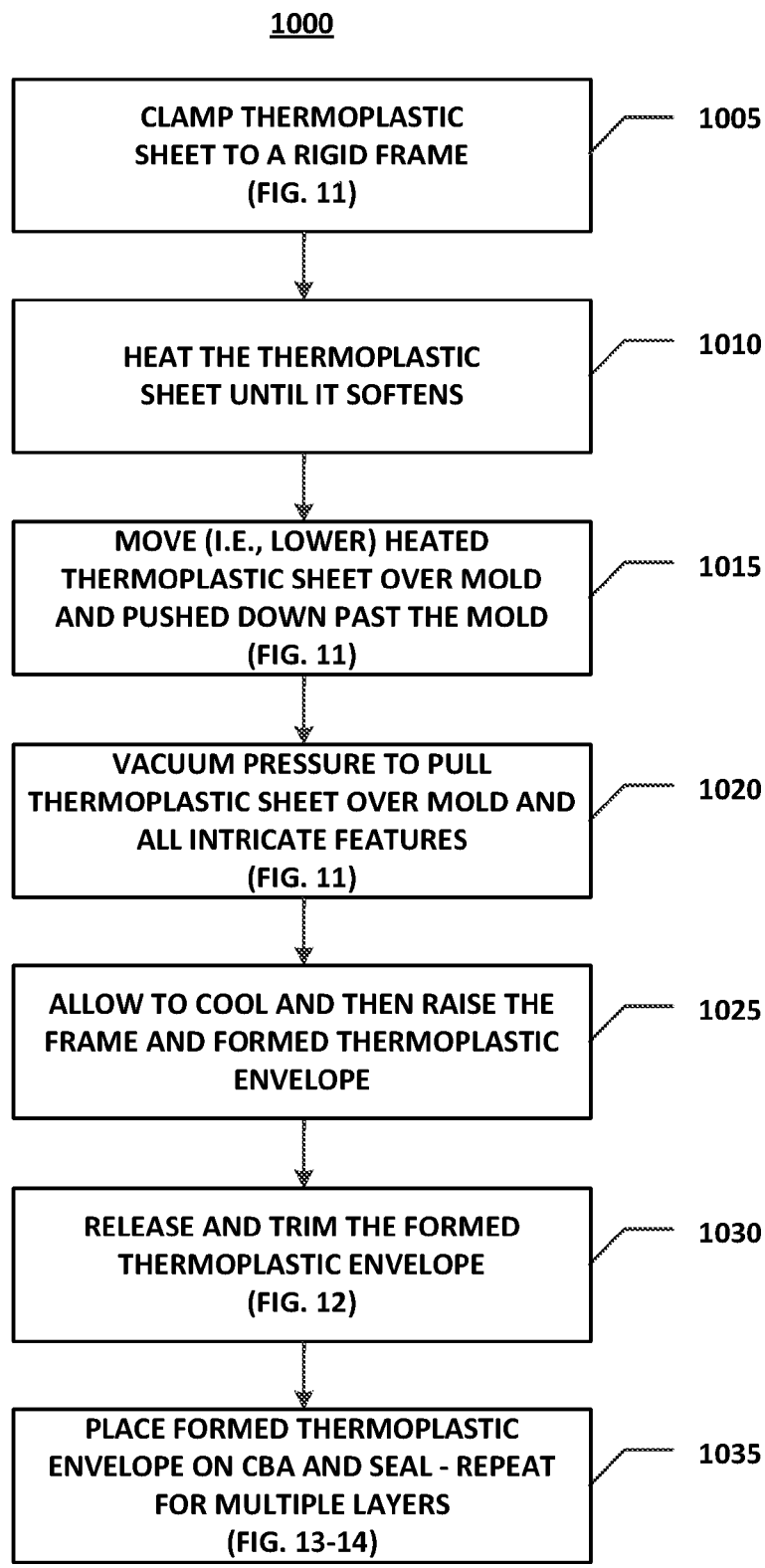
FIG. 10 is a more detailed flow chart of the polymer layer forming phase of the layering process of FIG. 2, according to a first embodiment of the present invention.
Figure 11:
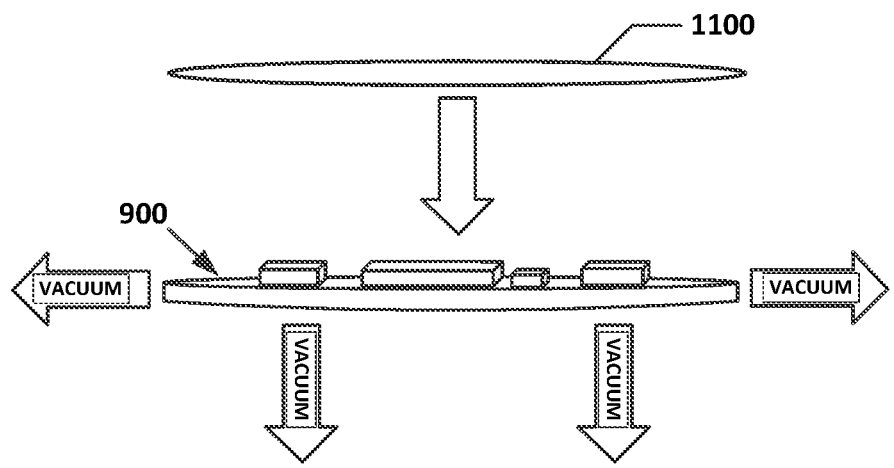
FIGS. 11 through 14 are illustrations of the various steps of the polymer layer forming phase of the layering process of FIG. 10.
Figure 12:
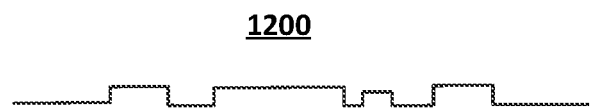

At step 315, the data/surface file is enlarged to another surface file 600 (FIG. 6), in order to accommodate for shrinkages of pattern(s), mold(s) and the protective films that will be deposited at a later stage of the phase 1000 (FIG. 10). In an exemplary embodiment, the data/surface file 500 was enlarged (i.e., grown) by approximately 0.012" in to accommodate for the shrinkage of the cast aluminum mold (approximately 0.009" in) and also for the shrinkage of the plastic films (approximately 0.003").

At step 320, the enlarged surface file 600 may be converted to a STEP or layer file to facilitate printing of the enlarged model by a SLA/stereo lithography machine or other rapid prototyping or model printing machines.

Figure 7:
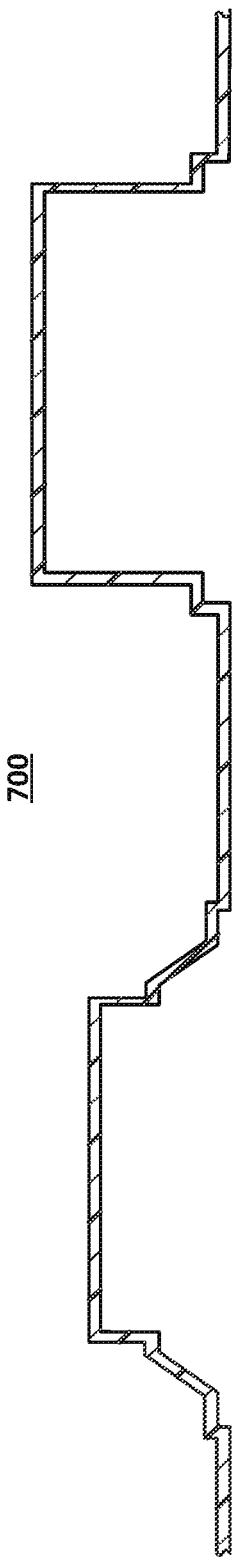

At step 325, a negative or cavity plaster mold 700 is created. FIG. 7 illustrates one such plaster mold 700. More specifically, in the exemplary embodiment, stereo lithography pattern was used to create the plaster mold 700. A core box, with sprue and runner, was added to the plaster negative mold 700 to enable positive metal casting using the plaster cavity mold. The plaster negative 700 was oven dried after it was cast.

At step 330, a positive male metal mold 800 is made from the plaster cavity mold 700. The male mold 800 is also referred to as a drape mold. FIG. 8 illustrates one such metal mold 800. In the present exemplary embodiment, molten aluminum was poured into the plaster negative mold 700 to make the aluminum positive mold 800. The aluminum positive mold 800 is wire brushed and cleaned.

At step 335, and as illustrated in FIG. 9, several holes, i.e., 910, 920, 930 are drilled in the aluminum positive mold 800 of FIG. 8, so the mold is capable of plastic forming. The holes 910, 920, 930 will enable vacuum suction of the polymer films that will be deposited according to phase 1000 of FIG. 10. In the exemplary embodiment, the aluminum mold 800 is wire drilled/electrical discharge machined (EDM) to provide the holes 910, 920, 930 for pulling a vacuum or vacuum forming of the thin polymer films.

One or more polymer layers can now be applied to the circuit board assembly 100 by forming the thin layers on a drape mold (also called a male mold) or a cavity mold (also called a female mold). The precise fit of the layers to the circuit board assembly 100 can be formed on metallic molds that are duplicate copies of the circuit board assembly 100. The accuracy of the mold is a result of the scanning and printing process described earlier, which provides a mold geometry that is more accurate than machining and which includes even the smallest of features and textures. Using a metallic mold enables precise control of heating and cooling that was not possible when using circuit board assemblies or printed wiring boards as forms or molding tools.

With reference to FIG. 10, it illustrates the polymer layer forming phase 1000 of the layering process 200 of FIG. 2, according to a first embodiment of the present invention. The phase 1000 summarizes the process of forming one or multiple polymer layers that are also referred to as protective jackets to the circuit board assembly 100 with vacuum.

The phase 1000 enables a manufacturer to furnish thin film, polymer layers for the supplied circuit board assembly 100 in a number of thermoplastic materials. The polymer layers act as a barrier for a variety of potting materials used to encapsulate the circuit board assembly 100, to fill undesirable voids, and to adapt to discrepancies in the geometries of the electronic components of the circuit board assembly 100.

At step 1005 of the polymer layer forming phase 1000 of FIG. 10, a thin thermoplastic sheet 1100 (FIG. 11) is clamped (or affixed) to a rigid frame of the forming machine (not shown). While the thermoplastic sheet 1100 is still affixed to the rigid frame, it is heated at step 1010 under quartz lamps, until it softens. The thermoplastic sheet 1100 will sag when heated providing a visual that the thermoplastic sheet 1100 is ready to be formed. The heating temperature of the thermoplastic sheet 1100 varies with the material used. As an example, surface temperatures may vary between approximately 200° F. and 240° F. The heating step 1010 may for example take between approximately 20 to 40 seconds.

At step 1015, the thermoplastic sheet 1100 is moved (or lowered) over the drape or male mold 900. A machine slide enables the precise placement of the thermoplastic sheet 1100 film over the mold 900. As further illustrated in FIG. 11, the heated and softened thermoplastic sheet 1100 is lowered over the mold 900 and pushed down past the mold 900, to ensure a tight fit to the geometries of the electronic components of the circuit board assembly 100, as replicated on the male mold 900.

At step 1020, vacuum pressure of, for example, approximately 31 lbs. gauge is applied through the vacuum holes 910, 920, 930, to pull the thermoplastic sheet 1100 further around all the intricate features of the electronic components of the circuit board assembly 100.

At step 1025, the thermoplastic sheet 1100 is allowed to cool on the mold 900 using fan-forced, room temperature air. The cooling step 1025 would take approximately 20 seconds. The frame of the molding machine containing the cooled, formed thermoplastic sheet (or envelope) 1200 (FIG. 12) is raised.

At step 1030, the thermoplastic envelope 1200 is released from the frame, and any excess material of the thermoplastic sheet 1100 trimmed.

Figure 13:
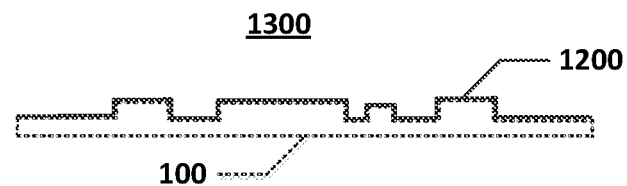
Figure 14:
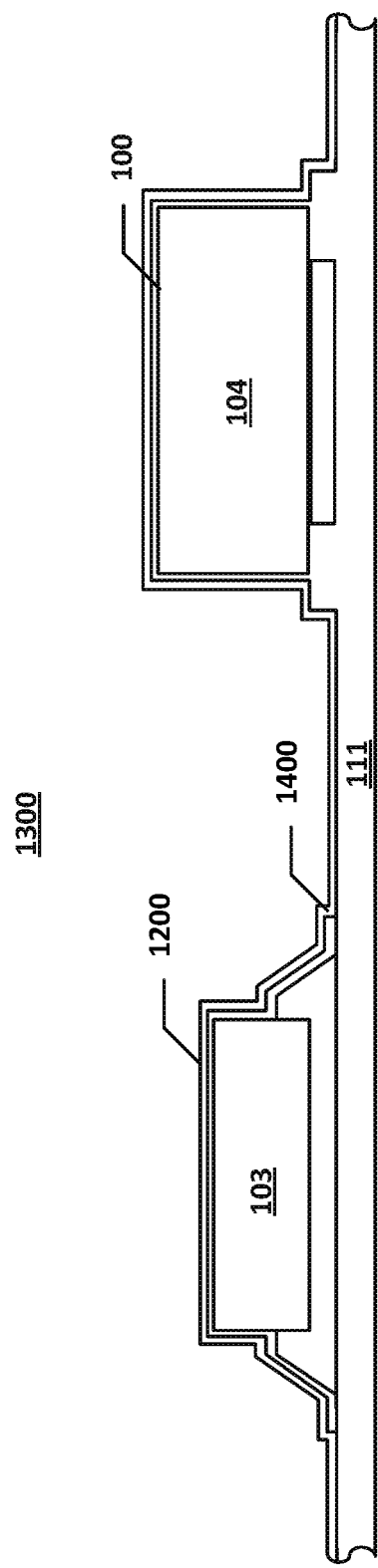

At step 1035, the thermoplastic envelope 1200 is placed on the circuit board assembly 100 (FIG. 13), and secured thereto. The enveloped circuit board assembly 100 is shown in FIGS. 13 and 14 and is designated by the numeral 1300.

The polymer layer forming phase 1000 may be repeated to form multiple layers on the circuit board assembly 100. The polymer layer forming phase 1000 offers a method of applying thin polymer layers over the electronic components of circuit board assemblies, which fit accurately around all components. The thin polymer layer(s) will have uniform thickness and consistent quality across the entire part as required by the application.

Figure 15:
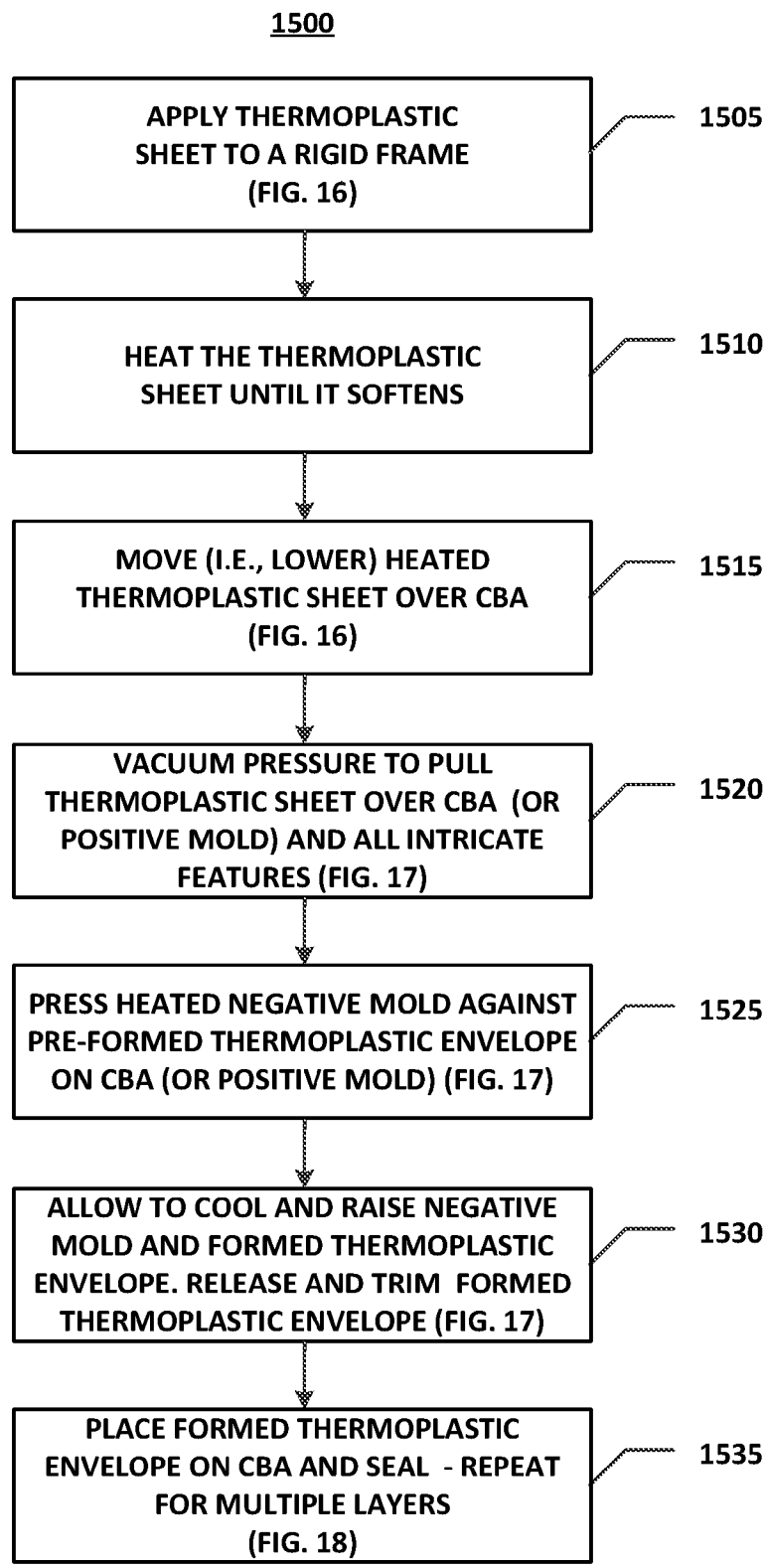
FIG. 15 is a more detailed flow chart of the polymer layer forming phase of the layering process of FIG. 2, according to a second embodiment of the present invention.

With reference to FIG. 15, it illustrates a polymer layer forming phase 1500 of the layering process 200 of FIG. 2, according to a second embodiment of the present invention. The phase 1500 summarizes the process of forming one or multiple polymer layers that are also referred to as protective jackets to the circuit board assembly 100 with vacuum.

At step 1505, a thin thermoplastic sheet 1100 (FIG. 16) is clamped (or affixed) to a rigid frame of the forming machine (not shown). While the thermoplastic sheet 1100 is still affixed to the rigid frame, it is heated at step 1510 under quartz lamps, until it softens. As indicated earlier, the thermoplastic sheet 1100 will sag when heated, providing a visual that the thermoplastic sheet 1100 is ready to be formed. The heating temperature of the thermoplastic sheet 1100 varies with the material used. As an example, surface temperatures may vary between approximately 200° F. and 240° F. The heating step 1010 may for example take between approximately 20 to 40 seconds.

At step 1515, the thermoplastic sheet 1100 is moved (or lowered) over the drape or male mold 900. A machine slide enables the precise placement of the thermoplastic sheet 1100 film over the mold 900.

Figure 16:
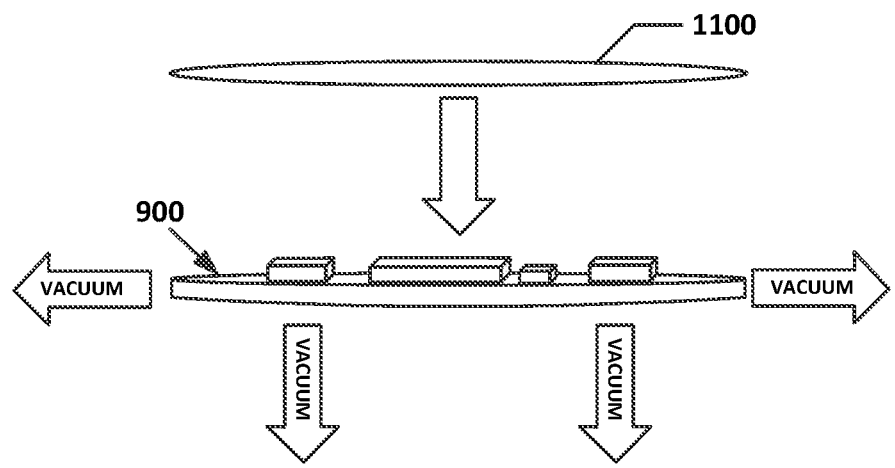
FIGS. 16 through 18 are illustrations of the various steps of the polymer layer forming phase of the layering process of FIG. 15.

At step 1515, and as further illustrated in FIG. 16, the heated and softened thermoplastic sheet 1100 is lowered over the mold 900 and pushed down past the mold 900, to ensure a tight fit to the geometries of the electronic components of the circuit board assembly 100, as replicated on the male mold 900.

Figure 17:
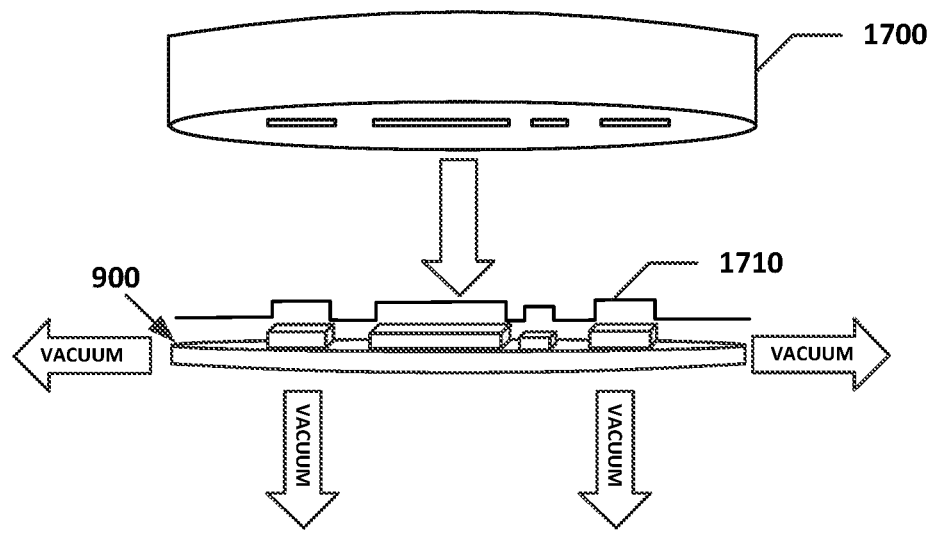

At step 1520, vacuum pressure of, for example, approximately 31 lbs. gauge is applied through the vacuum holes 910, 920, 930, to pull the thermoplastic sheet 1100 further around all the intricate features of the electronic components of the circuit board assembly 100. This step results in a preformed thermoplastic envelope (or layer) 1710 (FIG. 17).

At step 1525, a heated negative mold 1700 is pressed against the preformed thermoplastic envelope 1710 and the mold 900 to further increase resolution (fitment) including undercuts. The negative mold 1700 is then removed, and the thermoplastic envelope 1710 is allowed to cool on the mold 900 using fan-forced, room temperature air at step 1530. The cooling step 1525 would take approximately 20 seconds.

At step 1530, the thermoplastic envelope 1710 is released from the mold 900, and any excess material of the thermoplastic sheet 1710 trimmed.

Figure 18:
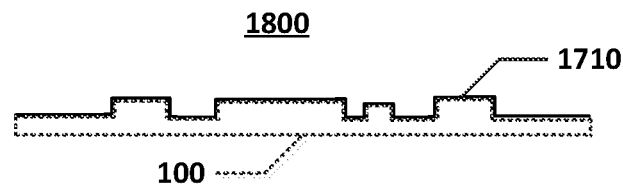

At step 1535, the thermoplastic envelope 1710 is placed on the circuit board assembly 100 (FIG. 18), and secured thereto, by for example, a layer of adhesive that can be applied to either the thermoplastic envelope 1710 or the circuit board assembly 100 (or both). The enveloped circuit board assembly 100 is shown in FIG. 18 and is designated by the numeral 1800. The polymer layer forming phase 1000 may be repeated to form multiple layers on the circuit board assembly 100.

Figure 19:
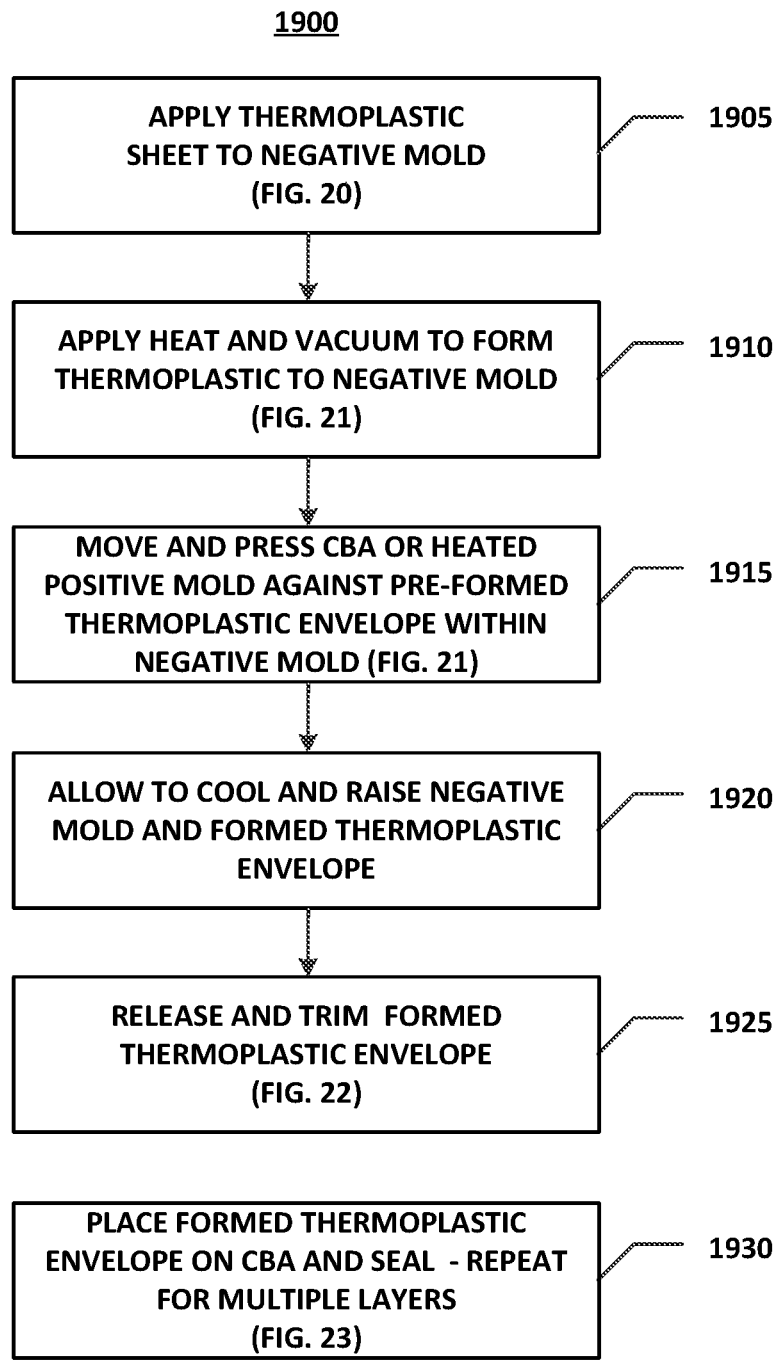
FIG. 19 is a more detailed flow chart of the polymer layer forming phase of the layering process of FIG. 2, according to a third embodiment of the present invention.

With reference to FIG. 19, it illustrates a polymer layer forming phase 1900 of the layering process 200 of FIG. 2, according to a third embodiment of the present invention. The phase 1900 summarizes the process of forming one or multiple polymer layers to the circuit board assembly 100 with pressure.

With further reference to FIGS. 20 through 23, the polymer layer forming phase 1900 provides an alternative method of forming a thermoplastic or polymer layer 1100 using a heated female tool or negative cavity mold 1700 that is oriented to face in the downward position, facing the polymer layer 1100. The negative mold 1700 includes heat or air channels that are switchable from pulling vacuum to applying air pressure.

Heated molds are sometimes oriented facing downward (also referred to as upside down). The main reason for this orientation is that the conveyor feed where the items, such as circuit board assemblies, can be dropped into nests and remain in their position under the effect of gravity. Once in the forming machine, the circuit board assembly 100 is raised up into the cavities for over-molding, dropped back down on the conveyor and the cycle is repeated. Most often the male or female molds are on a work surface facing upward as vacuum is normally mounted below the machine. In addition, molds lower on a surface and facing upward provide a line of sight into the mold so that the operators can monitor the complete process.

The topography of the negative mold 1700 includes cavities and small features 2000, 2010 (FIG. 20) that correspond to the geometries of the components of the positive mold 900 and the circuit board assembly 100. The phase 1900 can form polymer layers in a single operation, or it can be used as a secondary operation to press-fit polymer layers (formed by the other forming methods, such as methods 1000 or 1500) over existing circuit board assemblies or printed circuit boards.

One aspect of the polymer layer forming phase 1900 is to have layers of various thicknesses and polymer composition be superposed and fit tightly over the electronic components of the circuit board assembly 100. By forming the layers to the geometry of the electronics components, a barrier is created to separate the circuit board assembly 100 from potting materials. Potting materials are used to encapsulate the sensitive electronics and cast them into a solid body.

The polymer layer barriers prevent potting materials from flowing underneath small electronic chips or components where they can be lifted off the printed circuit boards due to thermal movement among the dissimilar materials. The polymer barrier layers further protect the electronic components during manufacturing, assembly, and further during the storage life and product use from potting liquids, moisture, contaminants, dust and corrosion.

Figure 20:
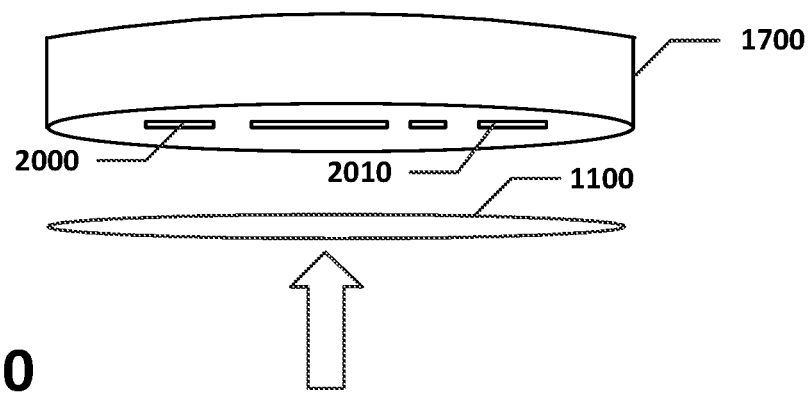
FIGS. 20 through 23 are illustrations of the various steps of the polymer layer forming phase of the layering process of FIG. 19.
Figure 21:
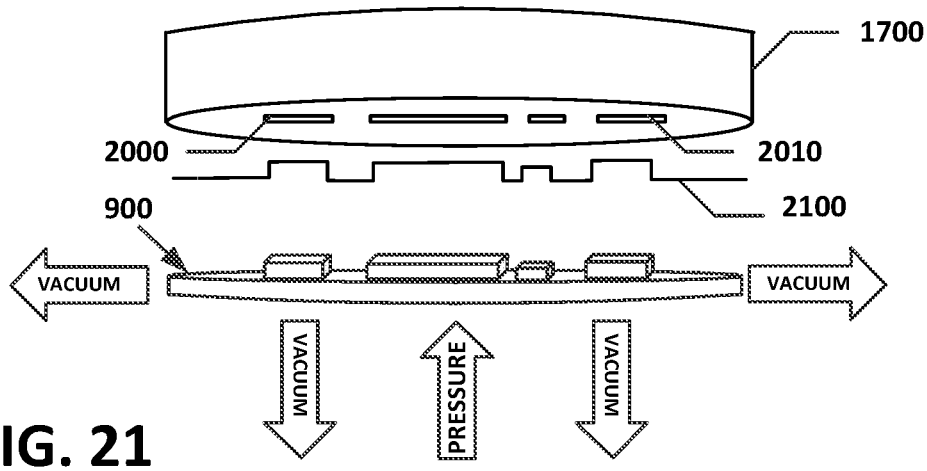

At step 1905, the heated thermoplastic sheet 1100 is applied to the negative mold 1700 (FIG. 20). At step 1910, vacuum pressure is used to pull the heated thermoplastic sheet 1100 tightly into the cavities and small features 2000, 2010 of the negative mold 1700, in order to produce a preformed thermoplastic envelope 2100 (FIG. 21).

The heated thermoplastic sheet 1100 conforms very accurately to the shape, placement, and geometry of the electronic components. As a result, the present phase 1900 addresses problems associated with the underside and vertical surfaces of the thermoplastic sheet 1100 and how closely it covers each electronic component. In order to accurately form the underside and internal sides of the thermoplastic sheet 1100, a drape or male mold is used in addition to the female mold (also referred to as cavity mold or appearance mold). A female mold may be used if surfaces of the mold need to be machined to produce larger parts. Female tools are considered "steel safe" because sections of the mold may be removed to accommodate larger electronic components.

At step 1915, and while the preformed thermoplastic envelope 2100 is still positioned at least in part, within the negative mold 1700, the positive mold 900 (or alternatively the circuit board assembly 100), is then moved into the cavities 2000, 2010 of the negative mold 2100, in such a way as to sandwich the thermoplastic envelope 2100 therebetween. This step will ensure that the thermoplastic envelope 2100 completely encases the geometries of components that are being protected.

While the thermoplastic envelope 2100 is still warm, the positive mold 900 is clamped in place to the negative mold 1700. The air direction in the negative mold 1700 is then reversed to press the thermoplastic envelope 2100 tightly over the geometries of the clamped positive mold 900.

At step 1920, the thermoplastic envelope 2100 is then allowed to cool and to shrink over the components geometries of the positive mold 900 (that correspond to the electronics components of the circuit board assembly 100). The thermoplastic envelope 2100 is cooled to a specific temperature in order to hold its shape and to prevent distortion.

Figure 22:
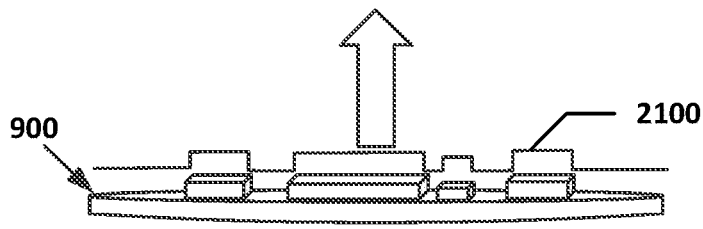

At step 1925, and as illustrated in FIG. 22, the thermoplastic envelope 2010 is released from the mold 900, and any excess material of the thermoplastic envelope 2010 is trimmed. As an example, the outside edges of the thermoplastic envelope 2100 are trimmed to the shape of the circuit board assembly 100. Temperature sensitive tape may be employed to bond the edges of the thermoplastic envelope 2100 shape to the flat of the circuit board 111 (FIG. 1).

Alternate methods of bonding the thermoplastic envelope 2100 barrier to the circuit board assembly 100 include adhesive bonding, solvent bonding to a texture, and ultrasonic welding to textures or three-dimensional features on the circuit board assembly 100. Also, an undercut, double bend or perimeter snap can be utilized to attach the thermoplastic envelope 2100 to the circuit board assembly 100 similarly to hardware blister packaging or food containers.

Figure 23:
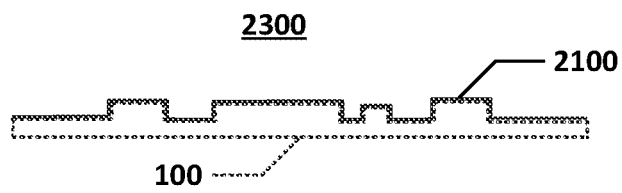

At step 1930, the thermoplastic envelope 2100 is placed on the circuit board assembly 100 (FIG. 23), and secured thereto, by for example, a layer of adhesive that can be applied to either the thermoplastic envelope 2100 or the circuit board assembly 100 (or both). The enveloped circuit board assembly 100 is shown in FIG. 23 and is designated by the numeral 2300. The polymer layer forming phase 1900 may be repeated to form multiple layers on the circuit board assembly 100.

The phase 1900 is also applicable to solve potential circuit board assembly electromagnetic interference (EMI) problems, and may include the following steps:

1) Application of an insulation layer to the components, section or assembly requiring protection. The layers will be tightly fit around components.

2) Application of an electrically conductive shielding product to the top of the first layer. These materials include metal foils, metalized fabrics or cloth, metal particle polymer composites, plated fiber composites, vacuum metalized layers, electroless plated layers, etc.

3) Solder or mechanically attach the shielding material to the ground features on the circuit board assembly 100.

In situations where the electronic devices of the circuit board assembly 100 have very high heat dissipation/generation, the following step will be added prior to the application of the electrically conductive shielding product to the top of the first layer:

Cut the non-conductive layers around the periphery of the hot electronic component, and remove the non-conductive cutout. Replace the removed non-conductive layers with high thermal conductive material or pad to transfer heat away from the electronic component.

Figure 24:
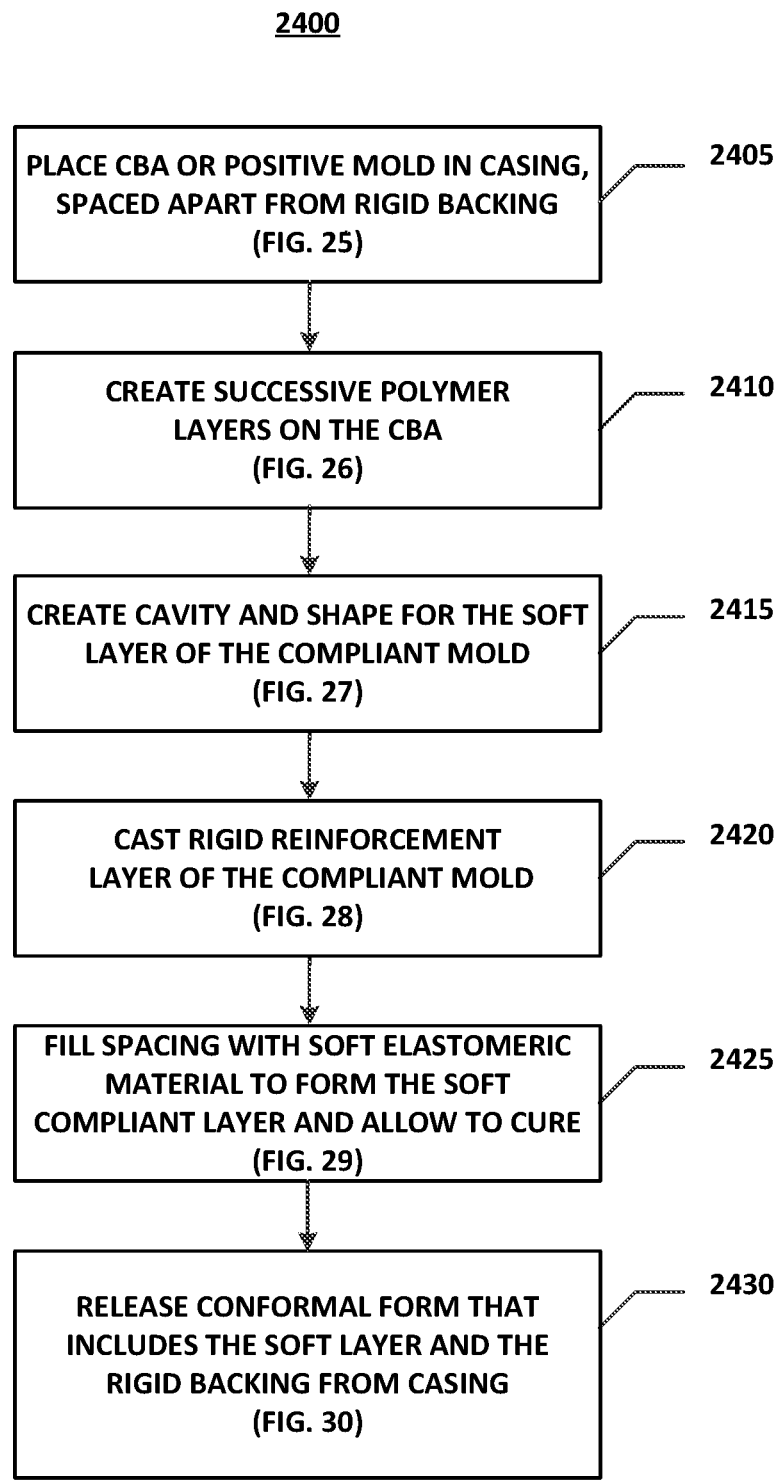
FIG. 24 is a more detailed flow chart of a conformal mold making phase of the layering process of FIG. 2.

FIG. 24 illustrates a conformal mold making phase of the layering process 200 of FIG. 2, which is referenced by the numeral 2400. According to this phase 2400, a conformal mold 2800 is fabricated with a flexible (soft or conformal) layer 2700 that is secured to a rigid layer (or backing) 2710 that enables the application of close-forming, encapsulating polymer layers (or layers) to the circuit board assembly 100 having complex and imprecise electronic component geometries. The imprecise geometries of the electronic components of the circuit board assembly 100 may be due to the normal electronic component geometrical tolerances as well as position-variations inherent in the circuit board assembly 100 manufacturing processes.

It is an objective of the conformal mold 2800 to provide a molding tool that applies equal pressure to the electronic components of the circuit board assembly 100, including surfaces that are perpendicular to the direction of forming (or molding). The soft (or flexible) durometer of the flexible (e.g., compliant) mold face will allow the polymer to flow or deform around individual electronic components, and the application of a force on the sides of the electronic components as well as to the projected or top surfaces of the electronic components. This dual-layer (soft-rigid) mold design is suited to form polymer layers over electronic devices with varying tolerances.

While soft presses are known to conform polymer layers to the circuit board assembly 100, as in U.S. Pat. No. 7,752,751, they have not been of substantially flat nature and have not been shaped to substantially match the shape of the circuit board assembly 100. Therefore, they do not apply pressure as uniformly to the polymer layer as the present invention.

The present invention includes creating the conformal or flexible face 2700 on a molding tool that will apply close-forming polymer layers on the circuit board assembly 100. The geometric variations of the circuit board assembly 100 include, for example: component-placement positioning variations; solder paste height variations; geometrical tolerances of the electronic components; and open-cavity devices (e.g., MEMs) seal thickness variations. With all these variations, the conformal mold 2800 of the present invention will provide consistent and accurate application of encapsulating polymer layers (or layers) over the individual electronic components.

It is an object of the phase 2400 to fabricate a conformal mold 2800 with a soft section 2700 whose shape is developed based on the combinations of the nominal dimensions of the electronic components of the circuit board assembly 100, the electronic components geometrical tolerances, and the electronic components placement variations. The conformal mold 2800 can be primarily constructed as a silicone or elastomer soft body which may be backed up by a rigid support plate 2710, or may be a shaped silicone or elastomer face on a rigid mold which follows the geometry of the circuit board assembly 100.

Referring now to FIG. 24, it illustrates the conformal dual-layer mold making phase of the layering process 300 of FIG. 2, which is also referred to as phase 2400 to distinguish this phase over the other mold making phases described herein.

Figure 25:
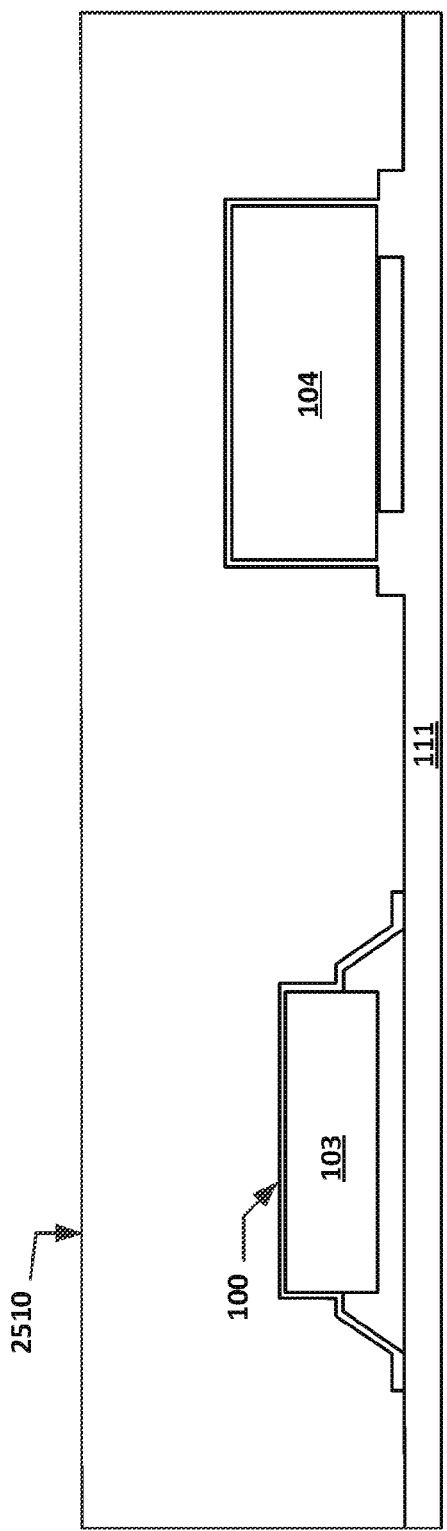

At step 2405, and with further reference to FIG. 25, the actual, populated circuit board assembly 100 (or an exact replica thereof, i.e., the positive mold 900) is placed in a casing or fixture 2510 that provides for accurate positioning and orientation of the circuit board assembly 100.

Figure 26:
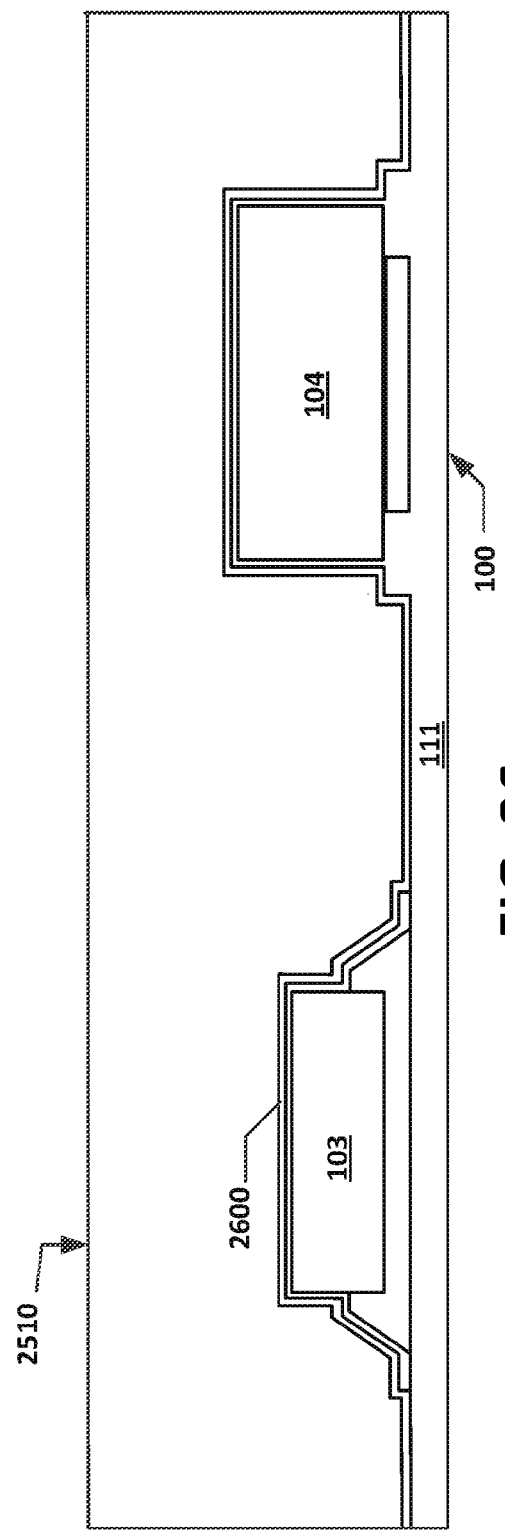

At step 2410, and with further reference to FIG. 26, in order to create the dual-layer mold 2800, a pattern of the final circuit board assembly 100 topography is created by applying successive, patterned polymer layers 2600 to the circuit board assembly 100. The polymer layers 2600 are of appropriate thicknesses and flexibility so that they closely form to the topology of the electronic components. The successive layers 2600 can be applied, for example, with heat and vacuum from below (or a heated dual-layer mold), and air pressure from above the circuit board assembly 100. Soft pads may be used to apply pressure over electronic components of the circuit board assembly 100. The successive polymer layers 2600 account for the actual thermoplastic sheets or layers that will formed at the later stage of the manufacturing process.

Figure 27:
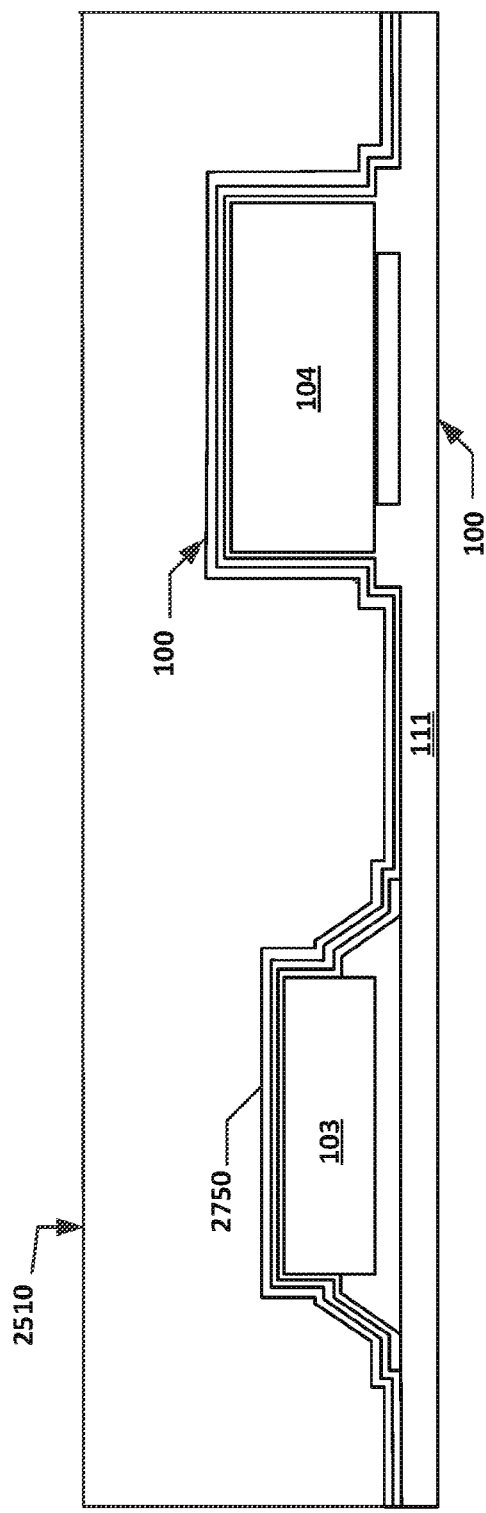

At step 2415, and with further reference to FIG. 27, in order to prepare a cavity and shape 2750 for the soft layer 2700 of the mold 2800, the number of successive polymer layers 2600 needs to be determined. Layer count and layer thickness are dependent on several factors, among which are the following: the requirements of the final encapsulated circuit board assembly 100 including environmental, physical and mechanical considerations; and the desired thickness of the soft layer 2700 to provide a robust forming tool while satisfying the service life expectancy. In creating the soft layer 2700, the thickness of the polymer encapsulation layers 2600 needs to compensate for the electronic components dimensional tolerances. Designing and creating the conformal mold (or soft) face 2700 to accommodate for component tolerance requirements ensures a constant interface pressure between the soft layer face 2700 and the polymer layers 2600 despite the geometric complexities of the electronic components.

Figure 28:
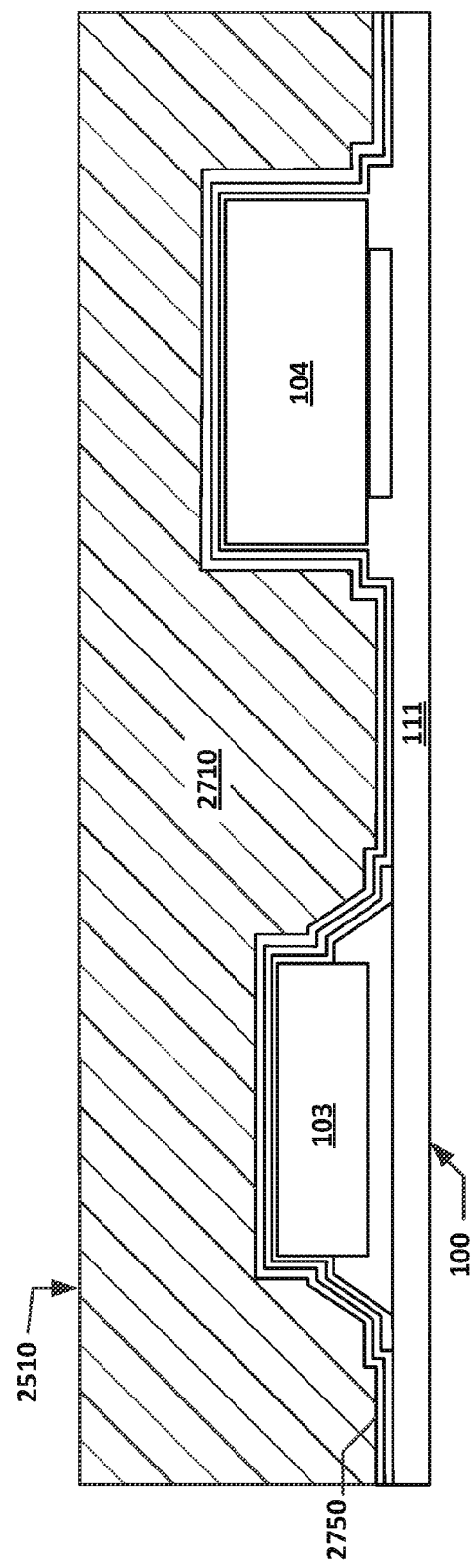

At step 2420, and with further reference to FIG. 28, the rigid reinforcement portion 2710 of the conformal mold 2800 is made using the fixture 2510 and the circuit board assembly 100 with the applied polymer layers 2600 and spacing 2750. The conformal or soft portion 2700 of the mold requires a high degree of details from the topography of the circuit board assembly 100, such as small surface mount devices, component leads, white-wires, etc. However, the rigid portion 2710 of the mold 2800 serves to strengthen the conformal face 2700.

As such, the rigid portion 2710 of the mold 2800 can be made from casting materials, usually thermoset resins with metal fillers, as the back or reinforcement is not expected to experience high stress or wear, nor excessively-high temperatures, while in use. The rigid portion 2710 of the mold 2800 may have features such as dovetails or keyways 3200 (FIG. 32) to mechanically engage the flexible material (soft layer) 2700 when poured, creating a mechanical bond between the two dissimilar materials. The casting is performed in such a way that it locates accurately with the fixture 2510 holding the circuit board assembly 100.

At step 2425, and with further reference to FIG. 29, the soft compliant portion 2700 of the conformal mold 2800 is formed by placing another actual circuit board assembly 100 or mold 900 into the fixture 2510, and by applying a very thin polymer layer 2900 as described earlier. This polymer layer 2900 is made as thin as possible to allow for the possibility that the electronic components sizes and positions on the circuit board assembly 100 may have ranged to their largest tolerances.

Next, a mold release is applied to the polymer layer 2900. In creating the soft mold face 2700, silicone (or another suitable elastomeric material with appropriate properties) is applied to the component-cavities 2750 (FIGS. 27, 28) and other surfaces that will face the circuit board assembly 100. During the pouring or injection of the flexible material for the soft mold face 2700, the silicone or equivalent material will flow into the locking features of the rigid mold backing 2710, bonding them as a single unit. Next, the combined mold 2800 is allowed to cure around the fixtured circuit board assembly 100. The height of the compliant mold 2800 relative to the circuit board assembly 100 must be controlled so that the flexible mold face thickness is maintained with regard to the circuit board assembly 100 and the electronic components thereon.

At step 2430, and with further reference to FIG. 30, once the flexible mold face material (soft layer 2700) has cured, the fixture (or molding tool) 2510 can be separated from the circuit board assembly 100. The compliant mold 2800, which includes both the soft layer 2700 and the rigid backing 2710, is now ready to be used to apply the encapsulation polymer layer(s) to the circuit board assemblies 100 with complex and imprecise geometries.

Figure 31:
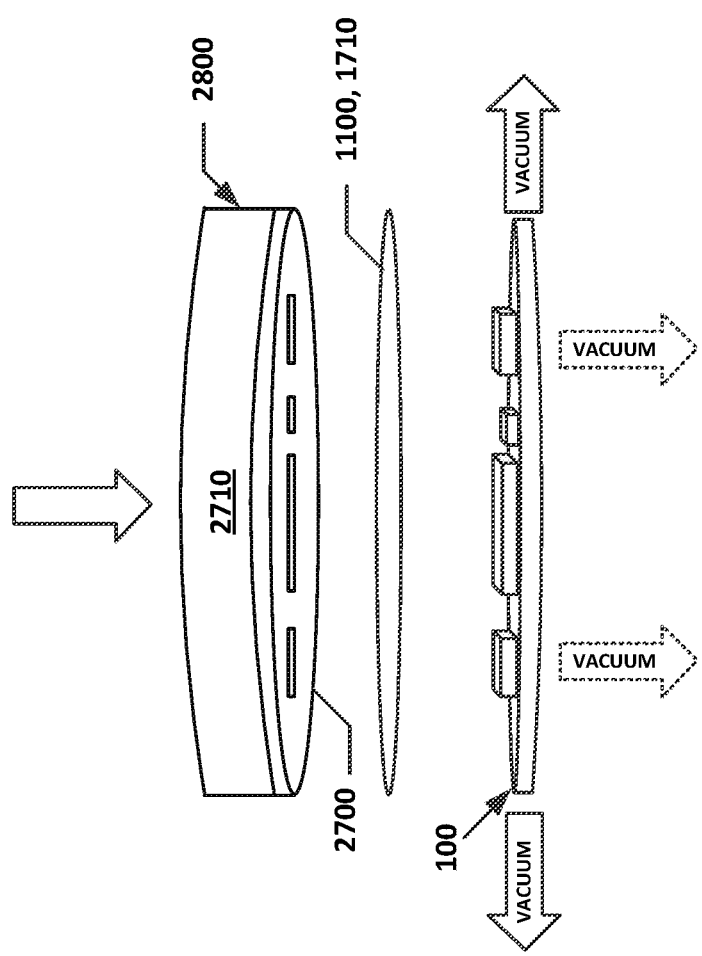
FIG. 31 shows the polymer layer forming phase of the layering process, using the conformal mold made using the mold making phase of FIGS. 24 through 30.
Figure 32:
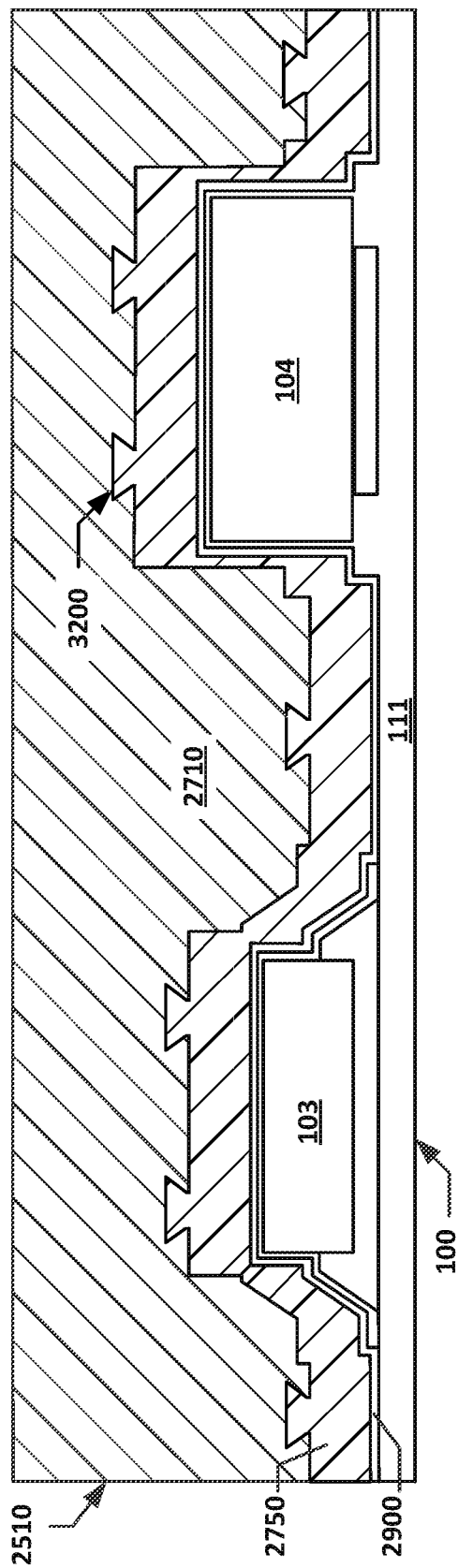
FIG. 32 is an illustration of another embodiment of the conformal mold of FIGS. 24 through 31.

FIG. 31 illustrates the process of applying one or more polymer layers to the circuit board assembly 100. In this process, a circuit board assembly 100 from a product line with imprecise geometries is ready for applying a close-forming polymer layer (or layers) 1100 or 1710 to its surface. The conformal mold 2800 is used to apply pressure to the polymer layer 1100 or 1710, as described earlier in connection with processes 1000 (FIG. 10), 1500 (FIG. 15), and 1900 (FIG. 19). As illustrated by the arrows in dotted lines, in some instances, it might not be possible or advantageous to apply vacuum from underneath the circuit board assembly.

If the height of the electronic components exceeds formability of a selected polymer layer, the circuit board assembly 100 could optionally be encapsulated by a polymer layer with cutouts around the tall component sections. Pre-formed polymer covers can be used to wrap around the tall components and joining procedures such as adhesives, solvent bonding, ultrasonic welding, or radio frequency sealing will ensure a tight seal between the circuit board assembly 100 polymer layer and the smaller polymer covers for the tall components.

The soft conformal mold face (or layer) 2700 may be made of a single material construction or multiple layers of different materials.

The conformal mold 2800 provides the ability to form or process polymer layers to a great degree of accuracy, resolution, and tolerance. While the forming methods 1000, 1500, and 1900 use heat, vacuum, and/or pressure, the conformal mold 2800 uses mechanical forming around the intricate components. The soft or conformal face 2700 of the conformal mold 2800 has the ability to mechanically form or shape the thermoplastic layers in addition to the vacuum or air pressure forming. The soft face 2700 of the mold 2800 is soft enough to flow around the electronic components when closed against the opposite mold or pressed tightly onto the populated circuit board assembly 100. In this manner, the soft geometry of the compliant mold face 2700 pushes the polymer layer not only on the top surface of components, but it also applies pressure to the layer on the sides of components as the compliant mold face 2700 deforms to comply with the geometries of the electronic components.

In addition, the present three-dimensional mechanical forming produces layers with a significant fit to the unique topology of the numerous circuit board assemblies despite minor differences on the height, axial and position tolerance of soldered components.

Figure 33:
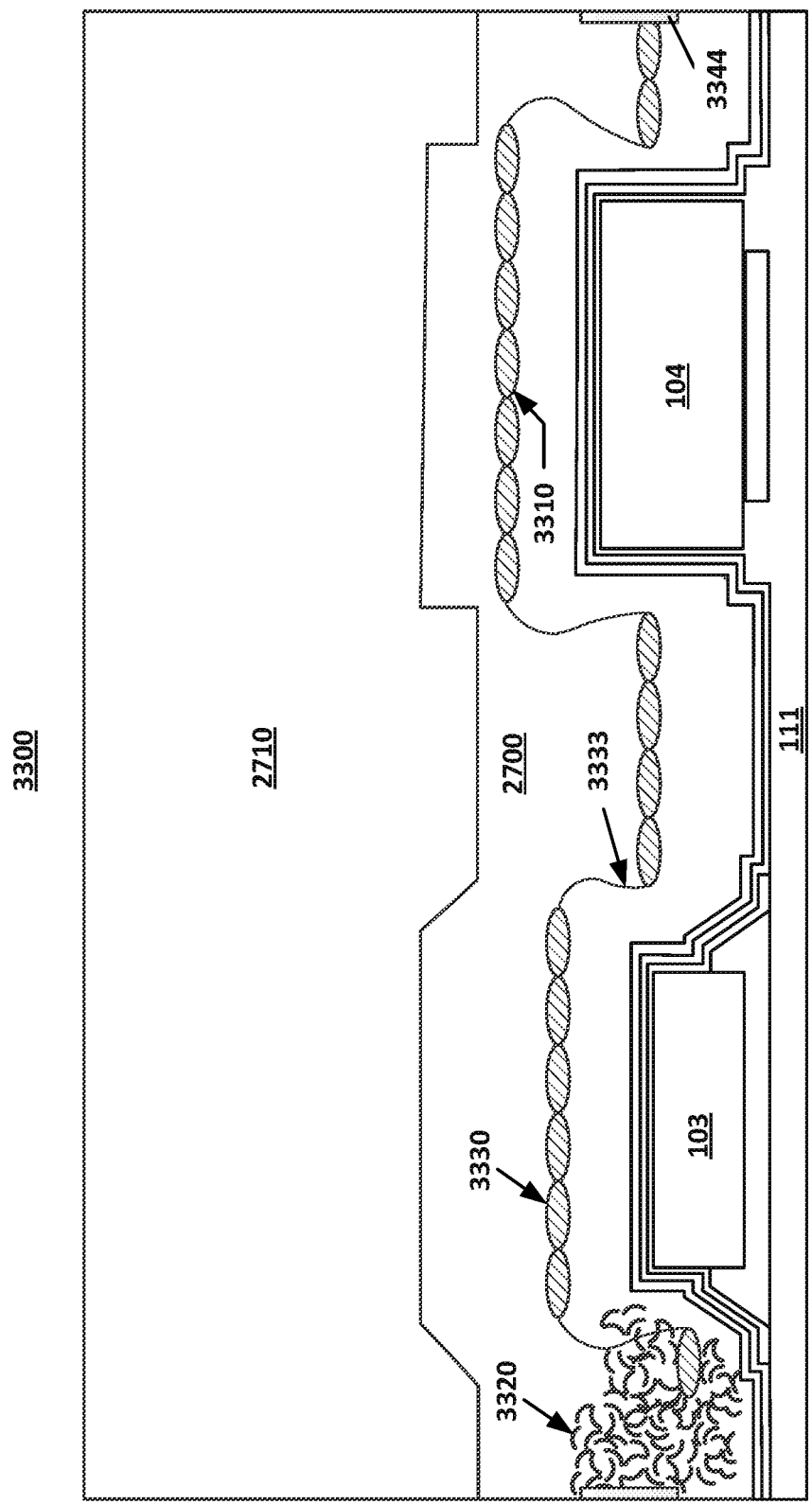
FIG. 33 is an illustration of still another embodiment of the conformal mold of FIGS. 24 through 31.

FIG. 33 illustrates a compliant mold 3300 according to another embodiment of the present invention. The soft compliant layer 2700 is formed according to process 2400, as described earlier, and is shown enlarged relative to its actual size for the purpose of illustration. Conductive traces 3310 are formed within the soft compliant layer 2700 in order to facilitate the heating of the soft compliant layer 2700.

In this particular exemplary embodiment, the conductive traces 3310 include thermally conductive fillers 3320, connecting wires 3333, and embedded heating pads 3330. One or more externally accessible pads 3344 may also be added.

While it is highly desirable to cause the conformal mold 2800 to form polymer layers around the electronic components and complex geometries, the soft compliant face 2700 that has an internal heat source (heat sources, or conductive traces) 3310 can form the parts faster and with greater accuracy. Elastomers and silicones are thermally non-conductive allowing very little heat to pass through the material even in thin cross sections.

It is an objective of the invention to create conformal or soft molds that are actually thermally conductive to soften thermoplastic layer material quickly. Using gentle heat from inside the soft mold 2700, the polymer layer materials are kept in the softened state until pressure from the mold completes the forming or net-shape. Air cooling, or cooling systems inside the forming machine, lower part temperatures to "freeze" the part so it can be handled and used immediately.

Exemplary mold heaters include for example, a silicone pad type while cartridge heaters, wire networks, ceramic elements and piped fluids are alternate heating methods.

To create heat transfer from the heating elements inside the conformal mold 3300 to the polymer layers, a thermally conductive mold material was developed. Thermally conductive fillers 3320 can be added to the silicone or elastomer mold materials while keeping the molds at Shore A durometers that range from 60-80. The fillers 3320 are small in size so the mold 3300 does not become too rigid and loose the conformal qualities.

Exemplary fillers include aluminum powder, copper platelets, alumina and boron particles, ceramic whiskers, metal-plated graphite fibers, tungsten fibers, and carbon black. Various ratios of filler to mold resin could be used, depending on the circuit board assembly 100.

The following exemplary filler composition using aluminum fillers to make the compliant molds 3300 resulted in the following:

15% filler provided minimal heat transfer;
25% filler provided 20-40% heat transfer;
37% filler provided 45-60% heat transfer; and
50% filler provided 65-75% heat transfer.

The compliant molds 2800 and 3300 allow a uniform thickness and consistent quality of polymer layers 1100 to be applied to the surface of the circuit board assembly 100 with complex and imprecise geometries. They also provide the numerous advantages among which are the following:

The compliant face 2700 of the mold 2800 enables forces in the X (left and right) and Y (front and back) directions, in addition to the Z (up and down) or the directions perpendicular to the draw.

The interface pressures between the compliant face 2700 and surfaces of all the components are substantially consistent.

The compliant face 2700 of the mold 2800 will adapt to the shape of the electronic components when it is pressed against the circuit board assembly 100 and the polymer layers 1100, and even allows the forming of polymers to minor undercuts;

The compliant face of the mold 2800 reduces the need for heavy draft used to release the encapsulated circuit board assembly 100 from the molding tool.

The compliant material of the mold 2800 can be cast with internal air channels or voids that enable the soft mold face 2700 to expand, to accommodate additional deformation, and to and stretch for compliant molding of intricate geometries and geometries with a high depth-to-draw ratio.

The processes of forming the polymer layers according to the present invention can be done using a combination of films (sometimes called cap stock) in a laminate or one layer formed on top of another. Multiple polymer layers can be designed to solve a variety of load and harsh environmental problems. The following examples are provided for illustration purpose:

Example A: Polymer Layer with EMC (Electro Mechanical Compatibility) Protection

The present process is suited to form a non-conductive layer followed by an electrically conductive layer to shield the circuit board assembly 100 against unintended electrical transmission or infiltration. The electrically conductive or shielding layer may utilize nickel plated fibers, metallic fibers, conductive veils or cloth, electro less nickel plating of the thermoplastic layer or vacuum deposition of metal particles on the polymer layer.

Example B: Insulative Polymer Layers

A protective barrier for extreme cold is readily accomplished using the present invention. First, a non-conductive layer is formed, followed by a "foamed" layer or a layer that has a cellular structure. The air bubbles or cells from the density reduction act as an effective insulator. Wires or pads internal to the polymer layers can function as instant heaters for cold start-up. Reference is made to FIG. 33.

Example C: Heat Extractor Polymer Layers

Plastics offer very little conduction of heat. So many circuit board assemblies rely on metal surfaces to radiate heat away from electrical and electronic components while other assemblies use mechanical movement of air or forced convection. There will be cases where the polymer layers will be formed (or molded) with air channels and/or wicking structures for heat pipes or heat extractors. Metal pads over components serve as thermal pick-ups which then pipe the heat outside of the enclosed area or to outside air.

The following is a non exclusive list of exemplary polymers that can be used to form the thermoplastic sheets or layers: polycarbonate, polyethylene, siloxane rubber, alloy grade with added styrene, polyolefin materials, low-density polyethylene, linear low-density polyethylene, high-density polyethylene, polypropylene, metalocene based polyethylene, polyvinyl chloride, and high impact polystyrene.

It should be understood that other modifications may be made to the present embodiments without departing from the spirit and scope of the invention.

What is claimed is:

1. A method for encapsulating a populated circuit board assembly having an imprecise geometry, with at least one protective layer that is tightly fit to the imprecise geometry of the populated circuit board assembly, the method comprising:
    making a mold of the populated circuit board assembly;
    using the mold to encapsulate the populated circuit board assembly with said at least one protective layer;
    wherein making the mold includes:
        scanning the populated circuit board assembly to create a surface file of the populated circuit board assembly;
        enlarging the surface file to accommodate for variations of the mold and said at least one protective layer;
        using the enlarged surface file to create a positive mold;
    wherein encapsulating the populated circuit board assembly with said at least one protective layer includes:
        heating a first protective layer of said at least one protective layer;
        drawing the heated first protective layer over and past the positive mold, in order to form an envelope with a substantially precise representation of the populated circuit board assembly;
        releasing the envelope from the positive mold; and
        placing the formed envelope onto the populated circuit board assembly to be encapsulated.

2. The method according to claim 1, wherein the variations of the mold and said at least one protective layer include shrinkage of the positive mold and thicknesses of said at least one protective layer.

3. The method according to claim 1, wherein the positive mold has a metallic composition.

4. The method according to claim 3, wherein the positive mold is made of aluminum.

5. The method according to claim 1, wherein making the mold further includes drilling vacuum holes in the positive mold.

6. The method according to claim 5, wherein encapsulating the populated circuit board assembly further includes applying vacuum through the vacuum holes to draw the first protective layer onto the positive mold.

7. The method according to claim 1, wherein encapsulating the populated circuit board assembly further includes heating the positive mold prior to drawing the first protective layer over and past the positive mold.

8. The method according to claim 1, further comprising repeating the steps of encapsulating populated circuit board assembly for each additional protective layer.

9. The method according to claim 1, wherein said at least one protective layer includes a polymer layer.

10. The method according to claim 1, wherein said at least one protective layer comprises multiple successively superimposed layers that include any one or more of: a thermally conductive layer, an electromagnetic shielding layer, an impact protection layer, and an environmental protection layer.

* * * * *